United States Patent
Jin et al.

(10) Patent No.: US 9,800,814 B2
(45) Date of Patent: Oct. 24, 2017

(54) IMAGE SENSOR, METHOD OF OPERATING THE SAME, AND IMAGE PROCESSING SYSTEM INCLUDING THE SAME

(71) Applicants: Young Gu Jin, Osan-si (KR); Ju Hwan Jung, Seoul (KR); Yoon Dong Park, Osan-si (KR)

(72) Inventors: Young Gu Jin, Osan-si (KR); Ju Hwan Jung, Seoul (KR); Yoon Dong Park, Osan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 239 days.

(21) Appl. No.: 14/816,486

(22) Filed: Aug. 3, 2015

(65) Prior Publication Data
US 2015/0341585 A1     Nov. 26, 2015

Related U.S. Application Data

(63) Continuation of application No. 14/043,169, filed on Oct. 1, 2013, now Pat. No. 9,106,858.

(30) Foreign Application Priority Data

Oct. 2, 2012   (KR) .................. 10-2012-0109716
Jan. 17, 2013   (KR) .................. 10-2013-0005210

(51) Int. Cl.
*H04N 3/14*     (2006.01)
*H04N 5/335*    (2011.01)
(Continued)

(52) U.S. Cl.
CPC ........... *H04N 5/37457* (2013.01); *G06T 5/20* (2013.01); *H01L 27/1463* (2013.01);
(Continued)

(58) Field of Classification Search
CPC .... H04N 5/374; H04N 3/1506; H04N 3/1512; H04N 5/3741; H04N 5/3742; H04N 5/37457
(Continued)

(56) References Cited

U.S. PATENT DOCUMENTS 4,677,453 A   6/1987   Matsumoto et al.
4,819,070 A   4/1989   Hynecek
(Continued)

FOREIGN PATENT DOCUMENTS

CN   1707804 A    12/2005
CN   101211942 A   7/2008
(Continued)

OTHER PUBLICATIONS

Tournier, Arnaud et al. "Improved Design of 1T Charge-Modulation Pixel Structure for Small-Size and Low-Dark-Current Achievements" International Image Sensor Workshop (IISW-2007) Ogunquit, Maine, USA: 2007.

(Continued)

*Primary Examiner* — Chia-Wei A Chen
(74) *Attorney, Agent, or Firm* — Harness, Dickey & Pierce, P.L.C.

(57) ABSTRACT

The image sensor includes a pixel array including a plurality of unit pixels each including a single transistor and a photodiode connected to a body of the single transistor, a row driver block configured to enable one of a plurality of rows in the pixel array to enter a readout mode, and a readout block configured to sense and amplify a pixel signal output from each of a plurality of unit pixels included in the row that has entered the readout mode.

18 Claims, 57 Drawing Sheets

(51) Int. Cl.
*H04N 5/3745* (2011.01)
*H04N 5/378* (2011.01)
*H04N 5/63* (2006.01)
*G06T 5/20* (2006.01)
*H04N 5/376* (2011.01)
*H01L 27/146* (2006.01)
*H04N 5/374* (2011.01)

(52) U.S. Cl.
CPC .. *H01L 27/14605* (2013.01); *H01L 27/14614* (2013.01); *H01L 27/14616* (2013.01); *H01L 27/14643* (2013.01); *H04N 5/374* (2013.01); *H04N 5/378* (2013.01); *H04N 5/3745* (2013.01); *H04N 5/3765* (2013.01); *H04N 5/37455* (2013.01); *H04N 5/63* (2013.01); *G06T 2207/10024* (2013.01); *G06T 2207/10028* (2013.01)

(58) Field of Classification Search
USPC .................................................. 348/294–310
See application file for complete search history.

(56) References Cited

U.S. PATENT DOCUMENTS

| | | | |
|---|---|---|---|
| 5,430,312 A | 7/1995 | Yamada | |
| 7,355,644 B2 | 4/2008 | Tsuzuki | |
| 7,538,371 B2 | 5/2009 | Yang | |
| 7,777,168 B2 | 8/2010 | Tournier et al. | |
| 8,217,433 B1* | 7/2012 | Fife | G01N 27/4145 257/253 |
| 2005/0185007 A1 | 8/2005 | Miyasaka | |
| 2008/0048212 A1* | 2/2008 | Nakashima | H01L 27/14831 257/222 |
| 2008/0111170 A1* | 5/2008 | Kim | H01L 27/14609 257/292 |
| 2008/0277693 A1* | 11/2008 | Mauritzson | H01L 27/14603 257/205 |
| 2008/0290382 A1* | 11/2008 | Hirota | H01L 27/14627 257/291 |
| 2008/0309800 A1* | 12/2008 | Olsen | H04N 5/357 348/241 |
| 2009/0153708 A1* | 6/2009 | Hirota | H01L 27/14629 348/294 |
| 2010/0171854 A1 | 7/2010 | Yokogawa | |
| 2010/0182467 A1 | 7/2010 | Lee | |
| 2010/0231562 A1* | 9/2010 | Brown | G06F 3/0412 345/207 |
| 2010/0308212 A1* | 12/2010 | Tanaka | G01J 1/1626 250/214.1 |
| 2010/0320515 A1* | 12/2010 | Fossum | H01L 27/14609 257/292 |
| 2010/0321356 A1* | 12/2010 | Brown | H01L 27/14643 345/207 |
| 2011/0025893 A1 | 2/2011 | Kim et al. | |
| 2011/0049590 A1* | 3/2011 | Itonaga | H01L 27/14603 257/292 |
| 2011/0108897 A1 | 5/2011 | Koo et al. | |
| 2011/0261017 A1 | 10/2011 | Park et al. | |
| 2011/0273390 A1* | 11/2011 | Nakatsuji | G06F 3/0412 345/173 |
| 2012/0001056 A1* | 1/2012 | Fife | G01N 27/4145 250/208.1 |
| 2012/0001234 A1 | 1/2012 | Lim et al. | |
| 2012/0001236 A1* | 1/2012 | Fife | G01N 27/4145 257/253 |
| 2012/0001237 A1* | 1/2012 | Fife | G01N 27/4145 257/253 |
| 2012/0001615 A1* | 1/2012 | Levine | G01N 27/4145 324/71.5 |
| 2012/0001685 A1* | 1/2012 | Levine | H01L 27/14632 327/536 |
| 2012/0049043 A1* | 3/2012 | Lee | H01L 27/14603 250/208.1 |
| 2012/0056248 A1* | 3/2012 | Fife | G01N 27/4148 257/253 |
| 2012/0092536 A1* | 4/2012 | Hirota | H01L 27/14645 348/294 |
| 2012/0139018 A1* | 6/2012 | Narisawa | H01L 27/14689 257/292 |
| 2012/0161213 A1* | 6/2012 | Roy | H01L 27/14603 257/292 |
| 2012/0181581 A1* | 7/2012 | Hynecek | H01L 27/1464 257/222 |
| 2012/0228136 A1* | 9/2012 | Levine | G01N 27/4145 204/406 |
| 2012/0228159 A1* | 9/2012 | Levine | G01N 27/4145 205/789 |
| 2013/0009068 A1* | 1/2013 | Zhang | G01T 1/247 250/370.08 |
| 2013/0043479 A1* | 2/2013 | Kim | H01L 29/78696 257/60 |
| 2013/0044250 A1* | 2/2013 | Senda | H04N 5/3597 348/333.01 |
| 2013/0048832 A1* | 2/2013 | Peizerat | H01L 27/14634 250/208.1 |
| 2013/0063631 A1* | 3/2013 | Fujiki | H01L 27/14612 348/294 |
| 2014/0313387 A1* | 10/2014 | Vogelsang | H04N 5/3696 348/308 |

FOREIGN PATENT DOCUMENTS

| | | |
|---|---|---|
| CN | 102169883 A | 8/2011 |
| CN | 102804754 A | 11/2012 |
| JP | 2009-147056 A | 7/2009 |
| KR | 10-1109088 B1 | 1/2012 |
| WO | WO-2011/099336 A1 | 8/2011 |

OTHER PUBLICATIONS

Matsumoto, Kazuya et al. "A New MOS Phototransistor Operating in a Non-Destrucive Readout Mode" Japanses Journal of Applied Physics.vol. 24, No. 5, May 1985 pp. L323-L325.

Office Action issued by SIPO dated Jul. 3, 2017 for Chinese Patent Application No. 201310464857.4.

\* cited by examiner

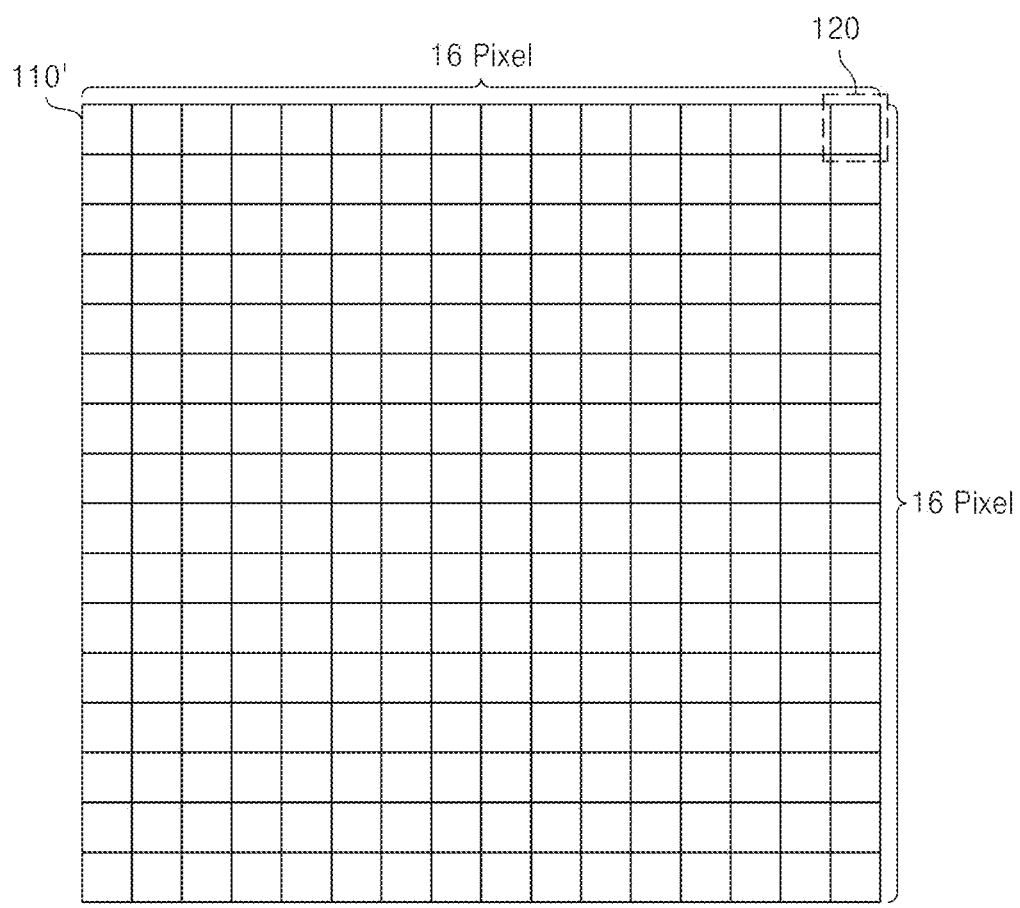

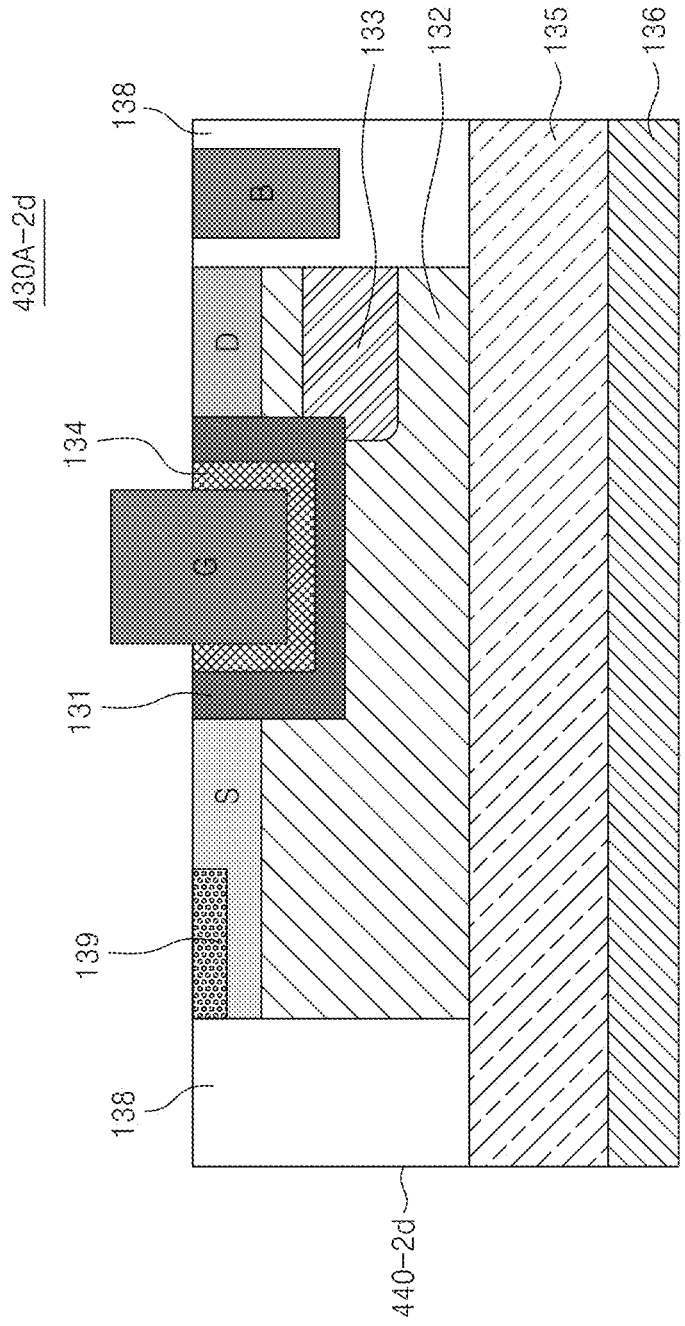

FIG. 39

| Voltage(V) | Vs (SVS) | Vg (GVS) | Vd (COL) | Vsub |
|---|---|---|---|---|
| INTEGRATION MODE | VINT1 | Vg | VINT2 | 0 |
| RESET MODE | VRESET1 | VRESET2 | 0 | 0 |
| READOUT MODE | VREAD1 | VREAD2 | Vout | 0 |

IMAGE SENSOR, METHOD OF OPERATING THE SAME, AND IMAGE PROCESSING SYSTEM INCLUDING THE SAME

CROSS-REFERENCE TO RELATED APPLICATIONS

This application is a continuation application of U.S. application Ser. No. 14/043,169, filed on Oct. 1, 2013, which claims priority under 35 U.S.C. §119(a) from Korean Patent Applications No. 10-2012-0109716 and No. 10-2013-0005210 respectively filed on Oct. 2, 2012 and Jan. 17, 2013, the entire contents of each of which are hereby incorporated by reference herein.

BACKGROUND

Example embodiments relate to an image sensor, a method of operating the same, and/or an image processing system including the same.

Complementary metal oxide semiconductor (CMOS) image sensors are sensing devices using CMOS. CMOS image sensors have lower manufacturing cost and smaller size than charge coupled device (CCD) image sensors having a high-voltage analog circuit and thus CMOS image sensors have an advantage of low power consumption. In addition, the performance of CMOS image sensors has been improved as compared to an early development stage, and therefore, CMOS image sensors are usually used for various electronic appliances including portable devices such as smart phones and digital cameras.

With the various uses of CMOS image sensors, the minimization of pixels in CMOS image sensors has been demanded. Therefore, a CMOS image sensor which includes a pixel array including smaller pixels and a driving circuit for driving the pixel array is desired.

SUMMARY

According to some example embodiments, there is provided a method of operating an image sensor. The method includes accumulating photocharge at a photodiode connected to a body of a single transistor, outputting a pixel signal according to the accumulated photocharge and a read voltage applied to a gate of the single transistor, and eliminating photocharge from the photodiode.

A top surface of the photodiode may be lower than a top surface of a source of the single transistor and a top surface of a drain of the single transistor.

The photodiode may be closer to the drain than to the source. The photodiode may be a virtual photodiode formed by a back-gate voltage applied to a back-gate.

A source of the single transistor may be connected with a drain of the single transistor through a channel.

The accumulating the photocharge may include inducing photocharge amplification by avalanche effect by applying a high voltage to at least one terminal among the gate, a source and a drain of the single transistor. The read voltage may be determined based on a threshold voltage of the single transistor.

The pixel signal may be a digital signal having at least two levels. The method may further include generating image data by processing the pixel signal.

The generating the image data may include grouping a plurality of sub pixels each outputting the pixel signal and processing pixel signals output from the grouped sub pixels.

According to other example embodiments, there is provided an image sensor including a pixel array including a plurality of unit pixels each including a single transistor and a photodiode connected to a body of the single transistor, a row driver block configured to enable one of a plurality of rows in the pixel array to enter a readout mode, and a readout block configured to sense and amplify a pixel signal output from each of a plurality of unit pixels included in the row that has entered the readout mode. The row driver block may control a source voltage and a gate voltage of each of single transistors included in the row to enable the row in the pixel array to enter the readout mode.

The row driver block may enable the plurality of unit pixels to enter an integration mode and a reset mode by controlling the source voltage and the gate voltage of the single transistors. The photodiode may accumulate photocharge varying with intensity of incident light in the integration mode. The accumulated photocharge may be eliminated in the reset mode.

A top surface of the photodiode may be lower than a top surface of a source of the single transistor and a top surface of a drain of the single transistor. The photodiode may be closer to the drain than to the source.

The unit pixels may further include a back-gate receiving a back-gate voltage from the row driver block.

The photodiode may be a virtual photodiode formed by the back-gate voltage. The unit pixels may further include a channel connecting a source and a drain of the single transistor with each other.

The channel may have at least one side contacting the photodiode.

The channel may be formed using Si, Ge, or SiGe.

The unit pixels may further include an internal photodiode between the channel and the photodiode and the internal photodiode may be formed using Ge or SiGe.

Single transistors adjacent in a column direction of the pixel array may share a source or a drain. The pixel array may further include a shallow trench isolation (STI) between single transistors adjacent in a row direction of the pixel array.

Alternatively, the pixel array may further include an STI between single transistors adjacent in the column direction and an STI between single transistors adjacent in the row direction.

The gate voltage for the readout mode may be determined based on a threshold voltage of the single transistor.

The single transistor may have a gate formed closer to a source than to a drain. The unit pixels may further include a reset terminal configured to eliminate the photocharge accumulated at the photodiode.

The pixel signal may be a digital signal and may include a reset signal and an image signal.

According to further example embodiments, there is provided an image processing system including an image sensor including a plurality of unit pixels each including a single transistor and a photodiode connected to a body of the single transistor, the image sensor amplifying and outputting a digital pixel signal from each of the unit pixels; and an image signal processor configured to process the digital pixel signal and to generate image data.

The unit pixels may further include a back-gate receiving a back-gate voltage from a row driver block, which enables the unit pixels to enter a readout mode in units of rows.

The image sensor may further include a color filter or a micro lens, which corresponds to each of the unit pixels. The image signal processor may treat each of the unit pixels as a single pixel and generate the image data by processing the pixel signal output from each unit pixel.

Alternatively, the unit pixels may be divided into a plurality of sub pixel groups including at least two unit pixels. The image signal processor may treat each of the sub pixel groups as a single pixel and generate the image data by processing pixel signals output from the at least two unit pixels in each sub pixel group.

The image sensor may further include a color filter or a micro lens, which corresponds to each sub pixel group.

According to other example embodiments of the inventive concepts, there is provided an electronic system including an image sensor including a plurality of unit pixels each including a single transistor and a photodiode connected to a body of the single transistor, the image sensor amplifying and outputting a digital pixel signal from each of the unit pixels; a processor configured to process the digital pixel signal, to generate image data, and to control an operation of the image sensor; a memory configured to store the image data and a program for controlling the operation of the image sensor; and a display unit configured to display the image data output from one of the processor and the memory.

At least one example embodiment relates to an image sensor.

In one embodiment, the image sensor includes a pixel array including a plurality of unit pixels configured to output digital pixel signals in a readout mode, each unit pixel having a single transistor and a photodiode connected to a bulk terminal of the single transistor, the photodiode configured to accumulate photocharge therein during an integration mode and the transistor configured to discharge the accumulated photocharge during a reset mode; and a plurality of sense amplifiers configured to amplify the digital pixel signal based on the digital pixel signal and a reference during the readout mode.

In one embodiment, the photodiode is configured to vary a threshold voltage of an associated transistor by varying a voltage level of the bulk of the associated transistor based on an amount of the accumulated photocharge therein.

In one embodiment, the image sensor is configured to perform analog to digital conversion by varying the threshold voltage of the single transistors without the use of an analog to digital conversion circuit.

In one embodiment, each unit pixel is configured to output one of at least two voltages as the digital pixel signal based on the threshold voltage of the associated transistor.

In one embodiment, each of the transistors have a source configured to receive a source voltage, a drain configured to receive a column voltage and a gate configured to receive a gate voltage, and the image sensor further includes a row driver configured to supply the source voltage to the source and the gate voltage to the drain of each of the transistors in a driven row of the pixel array to put the transistors in the driven row into one of the readout mode, the integration mode and the reset mode.

In one embodiment, the row driver is configured to put the single transistors in the driven row into the integration mode by deactivating the single transistors in the driven row.

In one embodiment, the row driver is configured to put the single transistors in the driven row into the readout mode by activating the single transistors in the driven row.

In one embodiment, the digital pixel signal output in the readout mode is a reset signal if a previous mode is the reset mode and the digital pixel signal output in the readout mode is an image signal if the previous mode is the integration mode.

In one embodiment, the unit pixels are configured such that a top surface of the photodiode is lower than a top surface of the source and the drain of the transistor.

BRIEF DESCRIPTION OF THE DRAWINGS

The above and other features and advantages of the inventive concepts will become more apparent by describing in detail exemplary embodiments thereof with reference to the attached drawings in which:

FIGS. 3A and 3B are diagrams for explaining a processing unit of a pixel array illustrated in FIG. 1;

FIG. 28D is a diagram of another example of the cross-section of a semiconductor substrate taken along the direction A in the layout illustrated in FIG. 26;

FIG. 39 is a diagram showing voltages applied to the unit pixel illustrated in FIG. 2 in different operation modes according to some example embodiments of the inventive concepts;

DETAILED DESCRIPTION OF THE EMBODIMENTS

Figure 1:
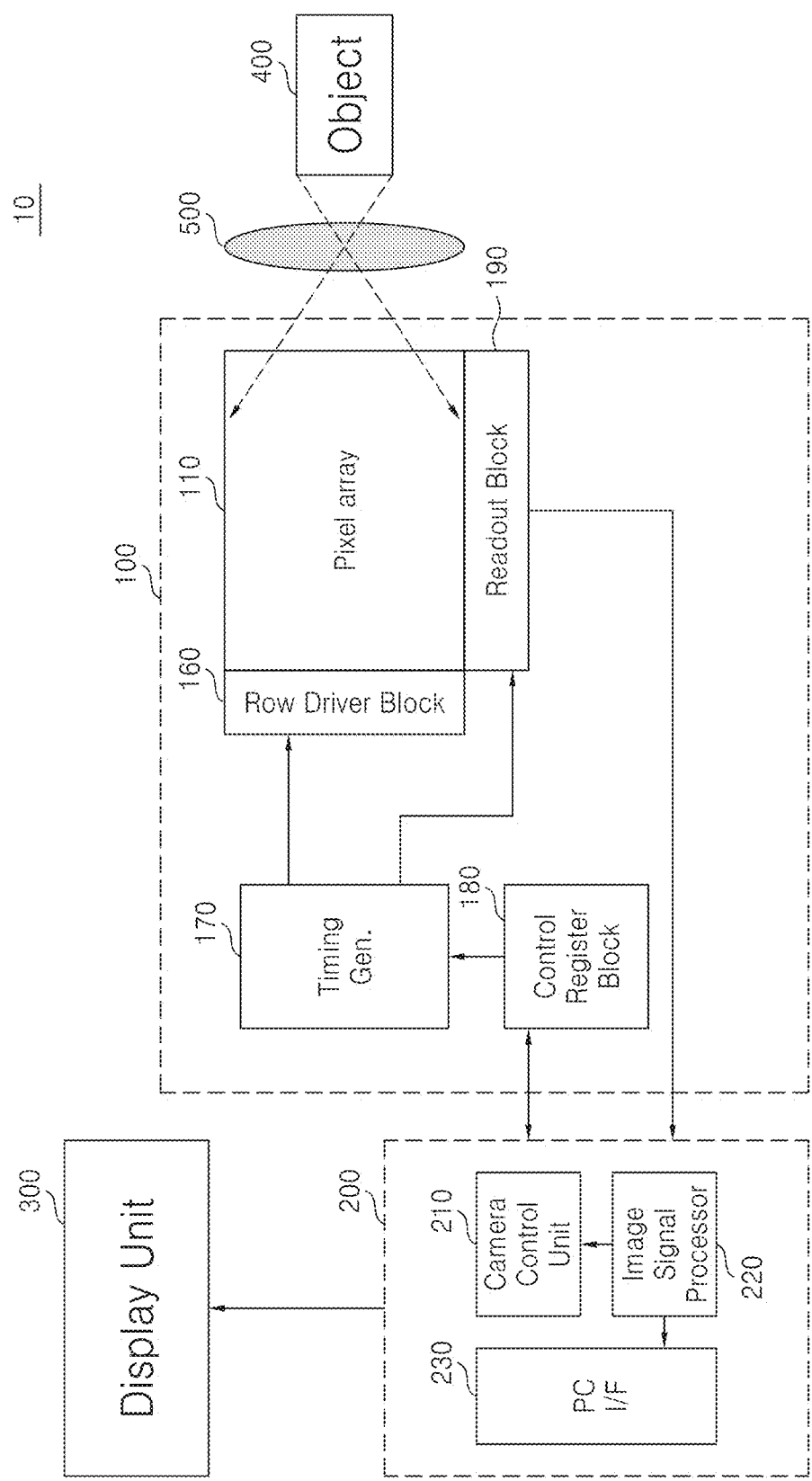
FIG. 1 is a block diagram of an image processing system according to some example embodiments of the inventive concepts.

The example embodiments now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image processing system according to some example embodiments of the inventive concepts.

As illustrated in FIG. 1, an image processing system 10 may include an image sensor 100, an image processor or a digital signal processor (DSP) 200, a display unit 300, and a lens 500. The image sensor 100 may include a pixel array 110, a row driver block 160, a timing generator 170, a control register block 180, and a readout block 190.

The image sensor 100 may be controlled by the DSP 200 to sense an object 400 captured through the lens 500. The DSP 200 may output an image, which has been sensed and output by the image sensor 100, to the display unit 300. At this time, the display unit 300 may be any device that can output an image. For instance, the display unit 300 may be implemented as a computer, a mobile phone, or an electronic device equipped with a camera.

The DSP 200 may include a camera control unit 210, an image signal processor 220, and a personal computer interface (PC I/F) 230. The camera control unit 210 controls the control register block 180. The camera control unit 210 may control the image sensor 100, and more specifically, the control register block 180 using an inter-integrated circuit ($I^2C$), but the scope of the example embodiments are not restricted thereto.

The image signal processor 220 receives image data, i.e., an output signal of the readout block 190, processes the image data into a viewable image, and outputs the image to the display unit 300 through the PC I/F 230. The image signal processor 220 is positioned within the DSP 200 in FIG. 1, but the design may be changed by those skilled in the art. For instance, the image signal processor 220 may be positioned within the image sensor 100.

The pixel array 110 may include a plurality of unit pixels. Each unit pixel includes a single transistor and a photoelectric conversion element such as a photo diode or a pinned photo diode. Each unit pixel in the pixel array 110 may include only one single transistor to increase the degree of integration of the image sensor 100. For instance, the image sensor 100 may include unit pixels having a size of 0.1×0.1 μm or less. The pixel array 110 senses light using a plurality of photoelectric conversion elements and converts the light into an electrical signal, thereby generating an image signal.

The timing generator 170 may output a control signal or a clock signal to the row driver block 160 and the readout block 190 to control the operations or the timing of the row driver block 160 and the readout block 190. The control register block 180 is controlled by the camera control unit 210 and stores various commands necessary for the operation of the image sensor 100.

The row driver block 160 drives the pixel array 110 in row units. The row driver block 160 may provide a reset voltage signal, a back-gate voltage signal, a source voltage signal, and a gate voltage signal for the single transistor of each unit pixel in the pixel array 110. In other words, the row driver block 160 may decode a control signal from the timing generator 170 and provide the reset voltage signal, the back-gate voltage signal, the source voltage signal, and the gate voltage signal for each of rows in the pixel array 110.

The pixel array 110 outputs a pixel signal including a reset signal and an image signal from a row selected by the source voltage signal and the gate voltage signal, which are provided from the row driver block 160, to the readout block 190. The readout block 190 temporarily stores the pixel signal from the pixel array 110 and senses and amplifies the pixel signal before outputting it. At this time, the readout block 190 may include a column memory (e.g., static random access memory (SRAM)) provided for each of columns in the pixel array 110 to temporarily store the pixel signal and a sense amplifier to sense and amplify the pixel signal.

When the image sensor 100 includes a depth sensor, the pixel array 110 may include at least one depth pixel and a light source (not shown) emitting modulated light with a phase difference. The image signal processor 220 may process image data from the image sensor 100, calculate a distance between the image sensor 100 and the object 400 using a time of flight (TOF) method, and generate a depth image.

Figure 2:
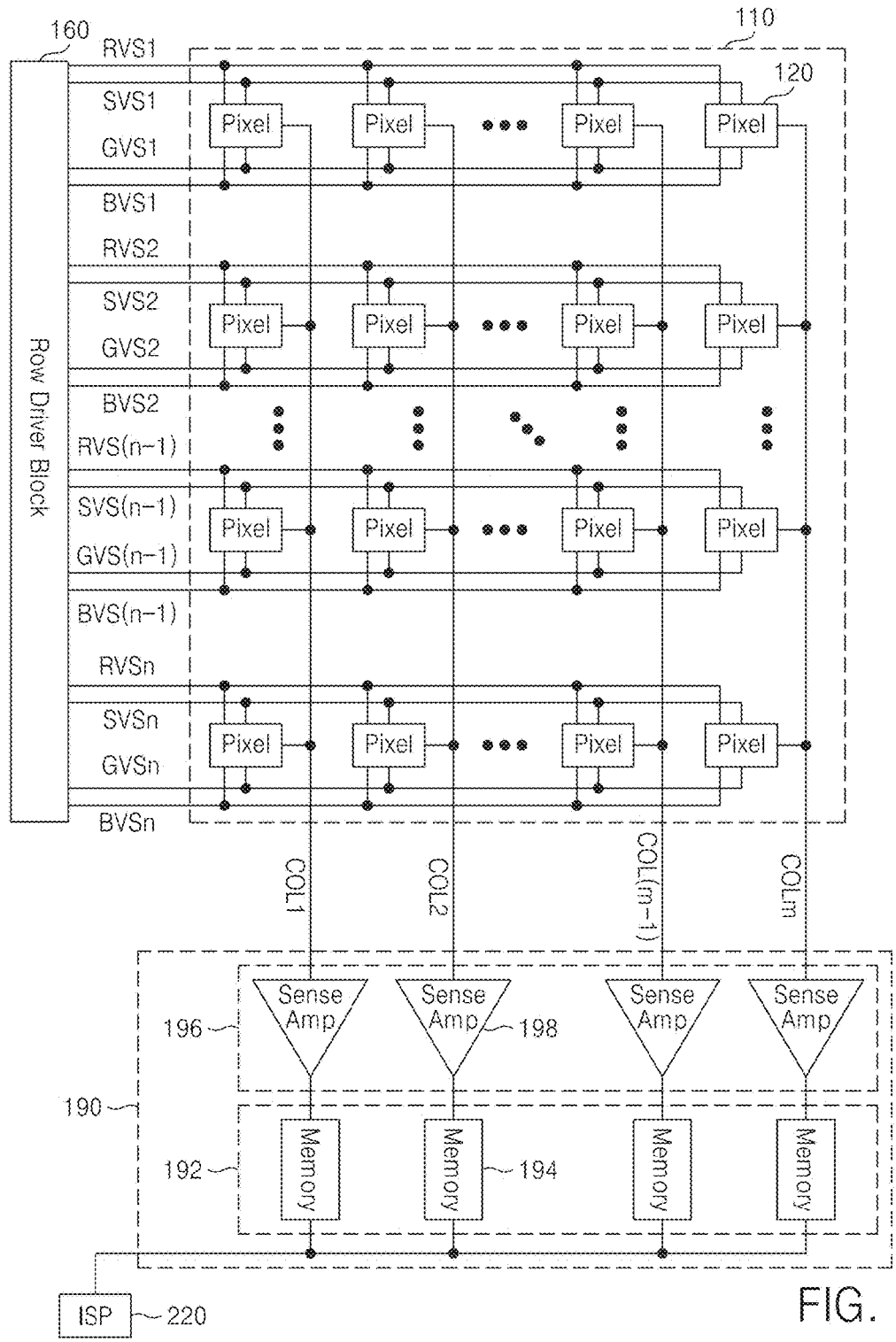
FIG. 2 is a detailed block diagram of an image sensor illustrated in FIG. 1.

FIG. 2 is a detailed block diagram of the image sensor 100 illustrated in FIG. 1.

Referring to FIGS. 1 and 2, the pixel array 110 may be implemented in a matrix form of "n" rows and "m" columns. The rows in the pixel array 110 may be provided from the row driver block 160 with reset voltage signals RVS1 through RVSn, respectively, back-gate voltage signals BVS1 through BVSn, respectively, source voltage signals SVS1 through SVSn, respectively, and gate voltage signals GVS1 through GVSn, respectively, to operate.

Each pixel 120 in the pixel array 110 may have an integration mode, a reset mode, and a readout mode. These operation modes will be described in detail with reference to FIG. 10 later.

Pixels 120 in each row in the pixel array 110 may enter the integration mode, the reset mode, and the readout mode according to one of the reset voltage signals RVS1 through RVSn, one of the back-gate voltage signals BVS1 through BVSn, one of the source voltage signals SVS1 through SVSn, and one of the gate voltage signals GVS1 through GVSn.

The readout block 190 may include a column memory block 192 and a sense amplifier block 196. The column memory block 192 may include a plurality of memories 194 receiving a pixel signal from column lines COL1 through COLm, respectively, connected to the respective columns in the pixel array 110. Each of the memories 194 may be SRAM or dynamic RAM (DRAM). The column memory block 192 may temporarily stores a pixel signal that has been amplified and output by the sense amplifier block 196 and may output the pixel signal that has been temporarily stored to the image signal processor 220 according to the control of the timing generator 170. As will be described with reference to FIG. 10 later, the pixel signal may be treated as a digital signal when a great signal change occurs due to photocharge, and therefore, analog-to-digital conversion is not necessary.

The sense amplifier block 196 may include a plurality of sense amplifiers 198 connected between the pixel array 110 and the column memory block 192. The sense amplifiers 198 may amplify and output respective pixel signals, which are respectively output from the column lines COL1 through COLm in the readout mode, according to the control of the timing generator 170. For instance, the sense amplifier block 196 may compare the level of a pixel signal with a reference level and amplify the pixel signal to a desired (or alternatively, a predetermined) level. The pixel signal may be a digital signal having two levels (e.g., 0 and 1) or more levels (e.g., 0, 1, 2, and 3).

Figure 3B:
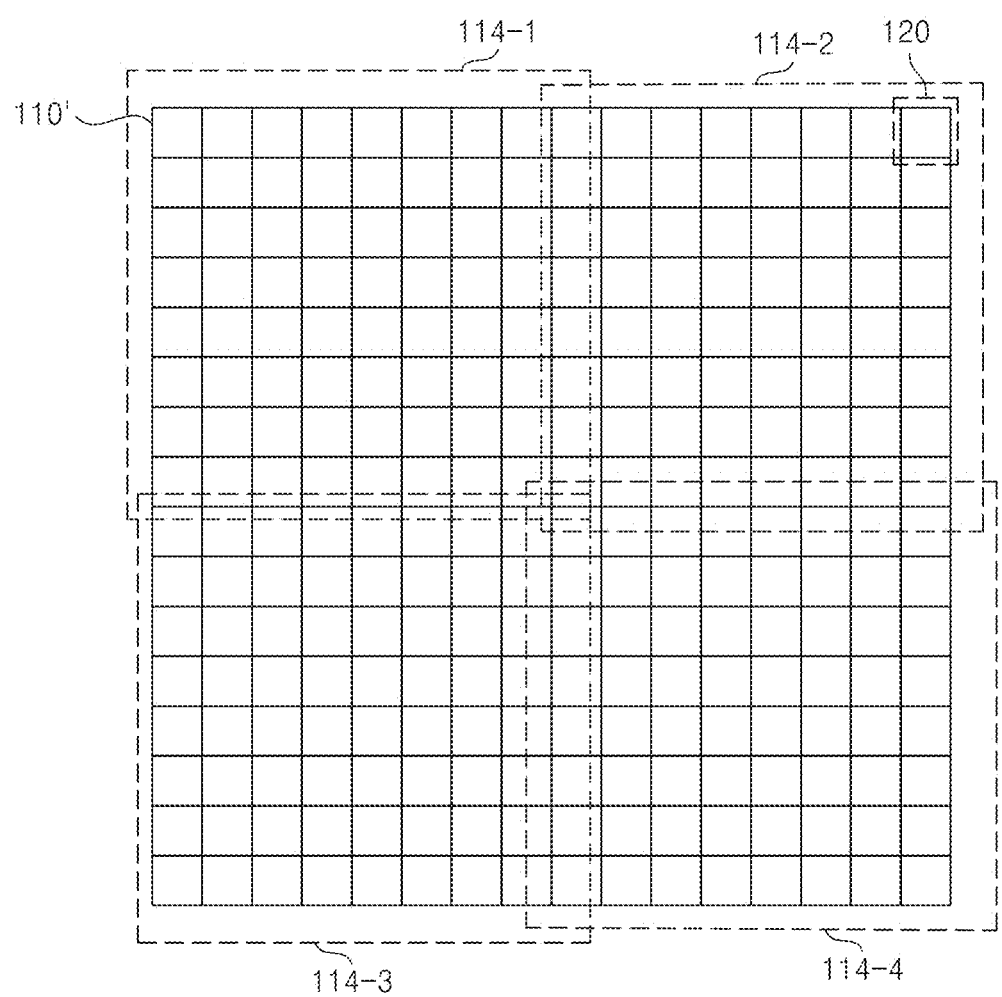

FIGS. 3A and 3B are diagrams for explaining a processing unit of the pixel array 110 illustrated in FIG. 1.

Referring to FIGS. 1 through 3B, FIGS. 3A and 3B show a part of the pixel array 110 including unit pixels 120 arranged in 16 rows and 16 columns.

Each unit pixel 120 may output a digital pixel signal. When it is assumed that the image sensor 100 acquires a color image or a depth image, the unit pixel 120 shown in FIG. 3A may be a red (R), green (G) or blue (B) pixel or a depth pixel. Since the unit pixel 120 includes only a single transistor (not shown) and a photodiode (not shown), it may be appropriate for the image sensor 100 requiring small pixel size. Digital pixel signals respectively output from the unit pixels 120 illustrated in FIG. 3A may be processed in a single frame by the image signal processor 220.

Referring to FIG. 3B, the unit pixels 120 may function as sub pixels. In detail, 64 sub pixels 120 may form one of sub pixel groups 114-1 through 114-4 having 8 rows and 8 columns. The sub pixel groups 114-1 through 114-4 may include the first and fourth sub pixel groups 114-1 and 114-4 including a red filter layer (not shown), the second sub pixel group 114-2 including a blue filter layer (not shown), and the third sub pixel group 114-3 including a green filter layer (not shown), thereby forming a Bayer pattern.

For instance, when it is assumed that a pixel signal output from each of unit pixels 120 included in the first sub pixel group 114-1 is a 1-bit digital pixel signal and when digital pixel signals output from the first sub pixel group 114-1 are added up in a single frame, 64 digital codes may be generated. Accordingly, when the first sub pixel group 114-2 is read out 16 times, 1024 codes may be generated, which corresponds to an analog signal that may have 1024 codes. Such pixel signal processing may also be applied to the second through fourth sub pixel groups 114-2 through 114-4. Although a case where digital pixel signals output from the first sub pixel group 114-1 are added up has been described in the current embodiments, different processing methods other than addition may be used in other embodiments. Although 64 sub pixels 120 construct each of the sub pixel groups 114-1 through 114-4 in the current example embodiments, the example embodiments are not restricted to the current embodiments.

Since the pixel array 110 in the image sensor 100 directly outputs digital pixel signals, a circuit for analog-to-digital conversion may be omitted. The circuit (for example, including a ramp circuit, a comparator, a counter, and so on) for analog-to-digital conversion is the cause of noise and power consumption. Therefore, the pixel array 110 of the image sensor according to the current embodiments reduces noise and power consumption.

Figure 4:
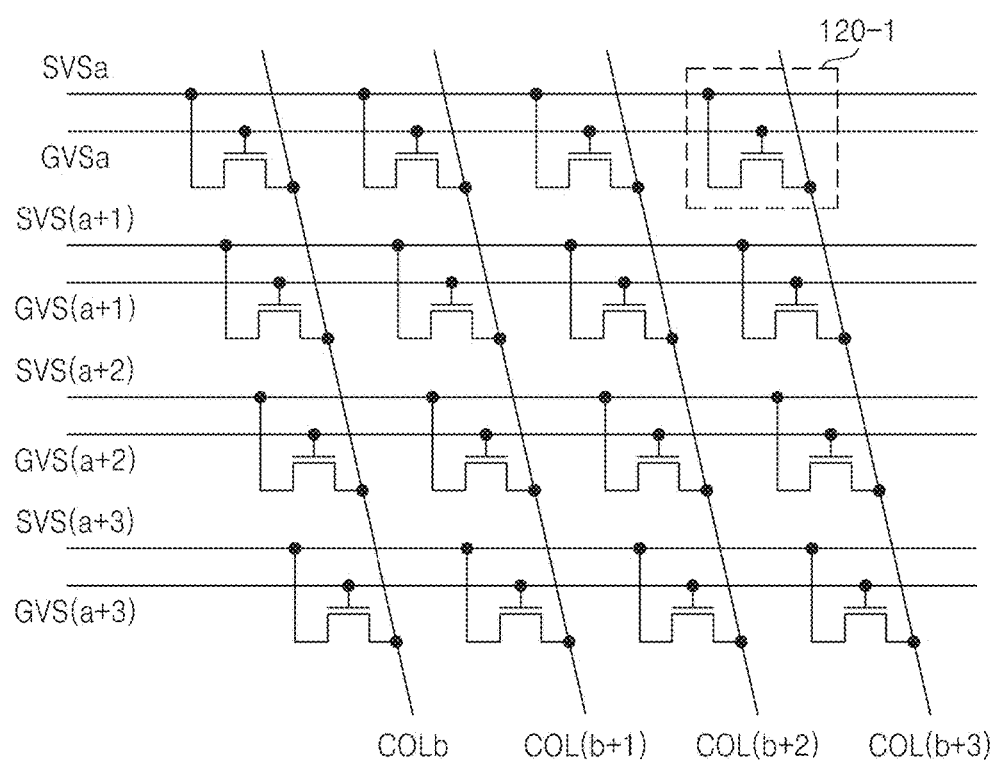
FIG. 4 is a schematic diagram of an example of the structure of the pixel array illustrated in FIG. 1.

FIG. 4 is a schematic diagram of an example of the structure of the pixel array 110 illustrated in FIG. 1.

Referring to FIGS. 1, 2, and 4, FIG. 4 shows a part 110-1 of the arrangement of the pixel array 110. Single transistors respectively included in unit pixels 120-1 are arranged in a matrix form. Each of the single transistors has a source and a drain independent from adjacent single transistors.

A single transistor included in each of the unit pixels 120-1 has a source and a gate, which are connected to the row driver block 160 and thus receives one of source voltage signals SVSa through SVS(a+3) and one of gate voltage signals GVSa through GVS(a+3). The single transistor also has a drain connected to the readout block 190 and may be connected to one of column lines COLb through COL(b+3) to output a pixel signal according to the control of the row driver block 160.

Figure 5A:
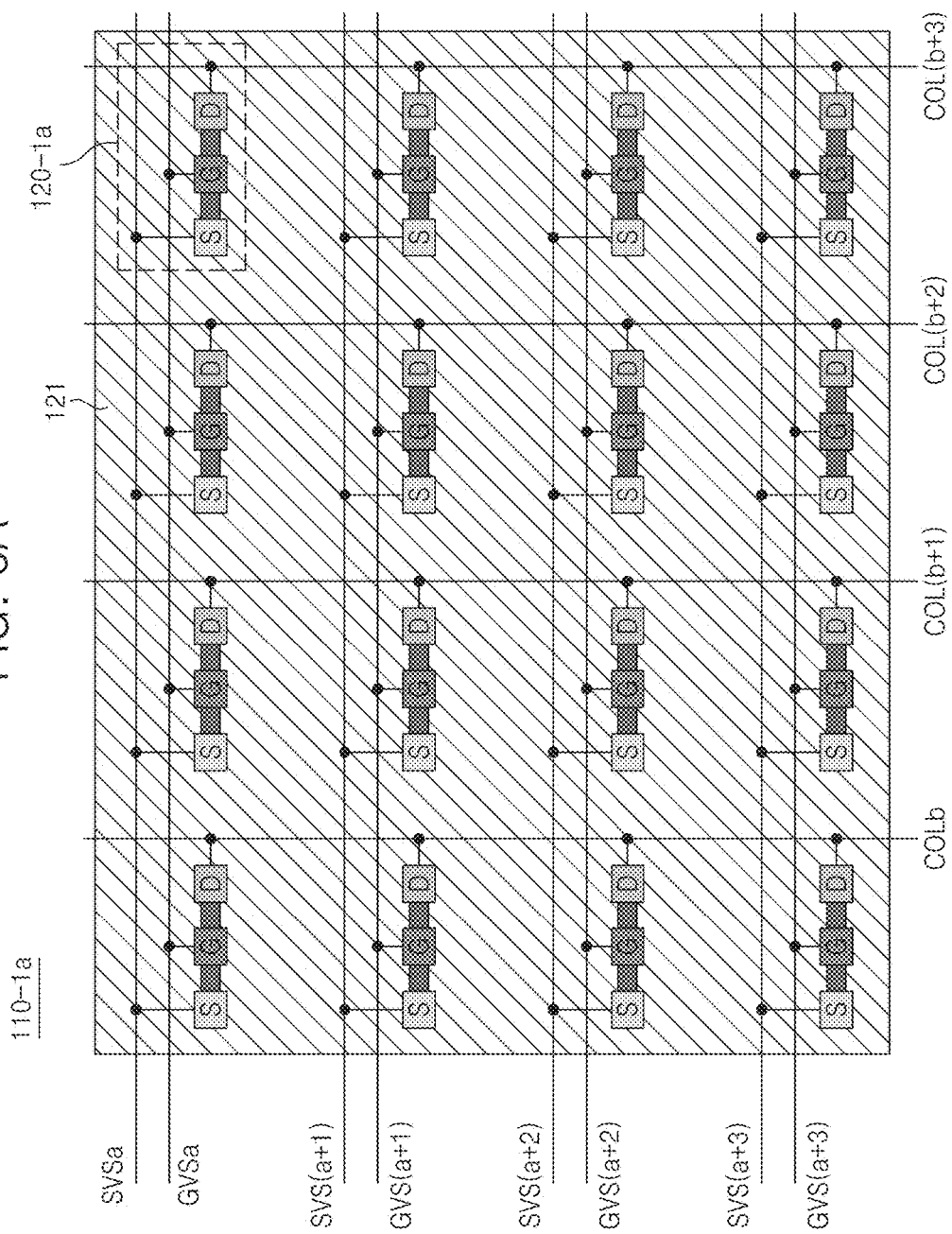
FIGS. 5A through 5C are diagrams of layouts for implementing the structure of the pixel array illustrated in FIG. 4.
Figure 5B:
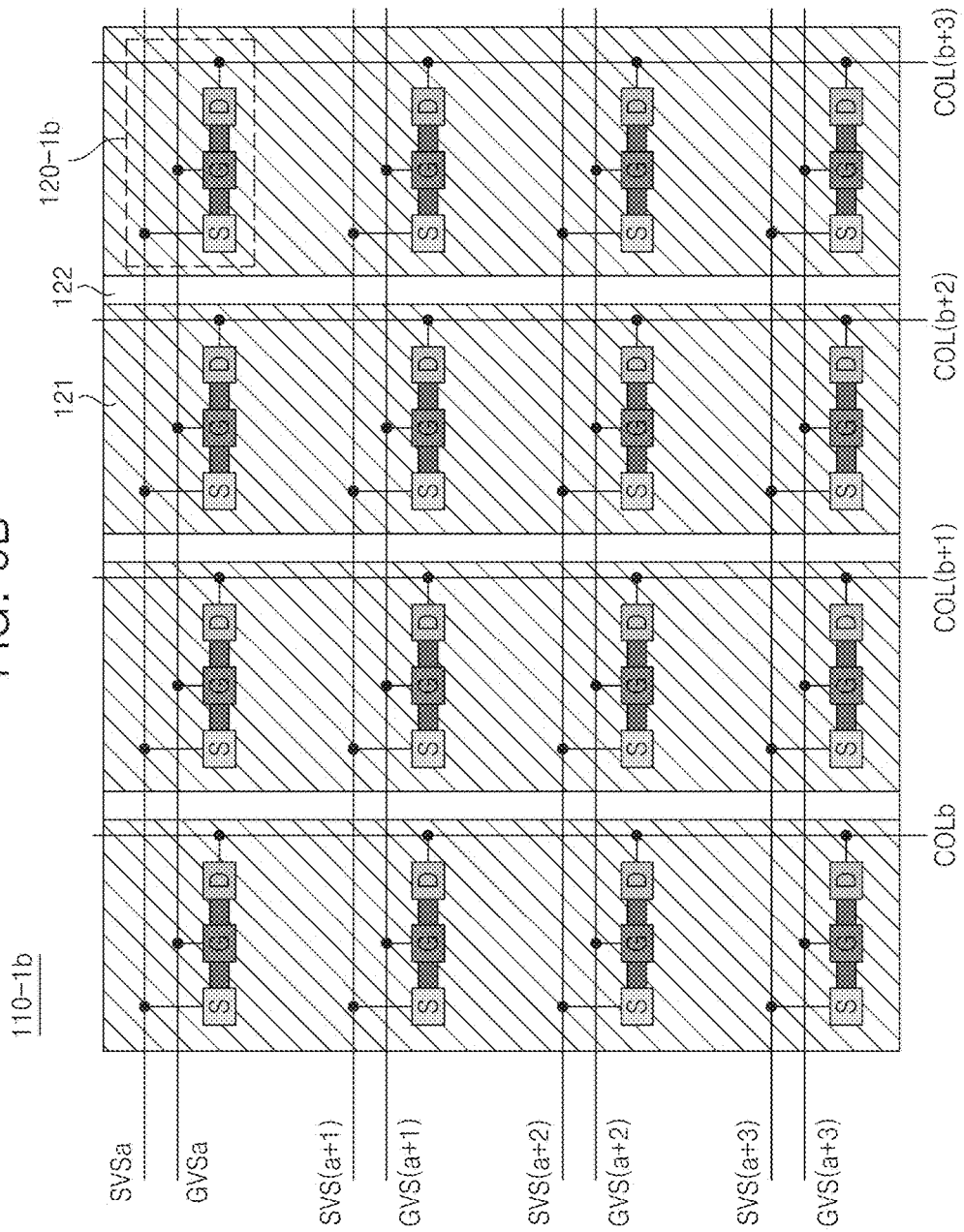
Figure 5C:
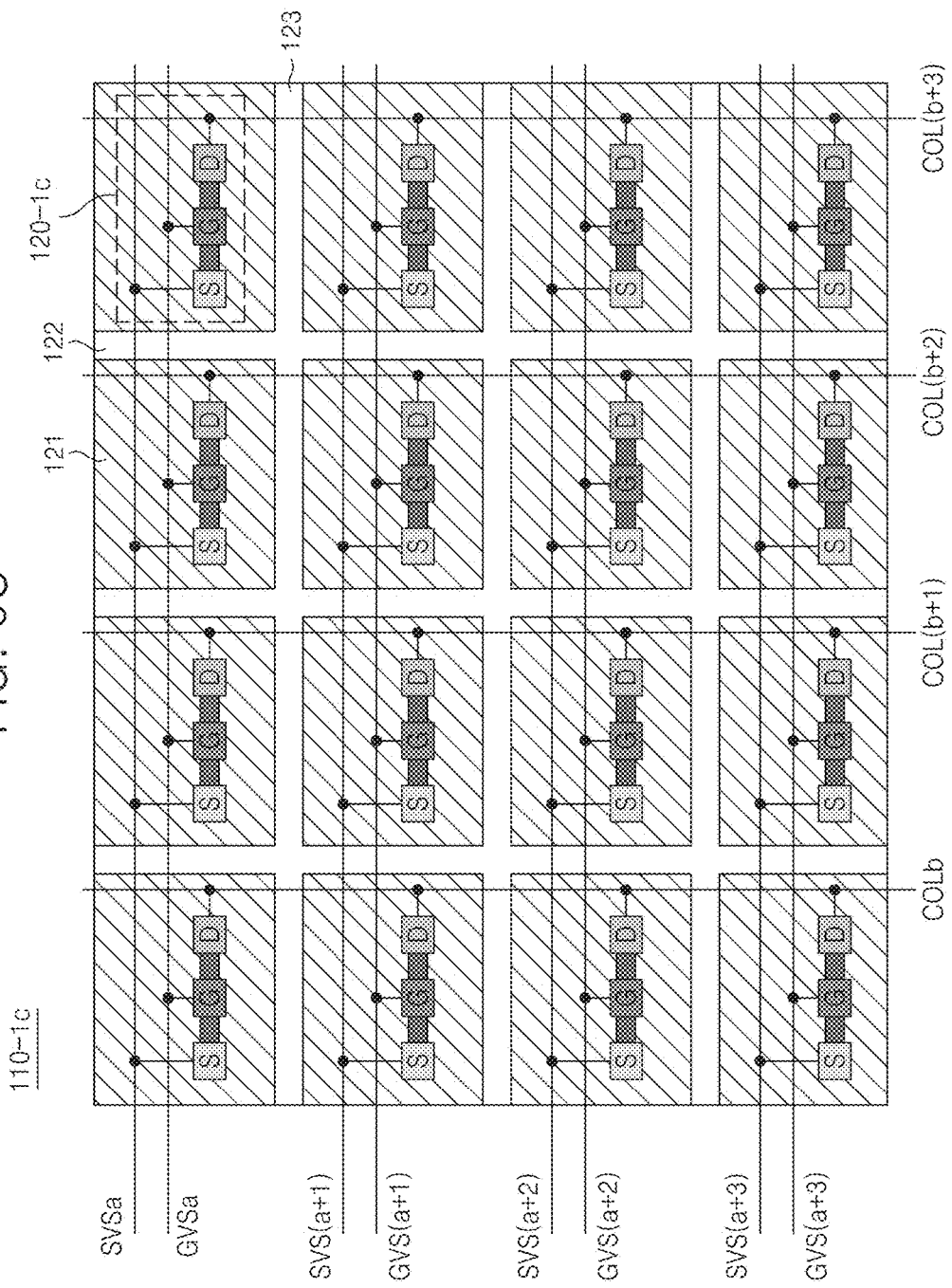

FIGS. 5A through 5C are diagrams of layouts 110-1a, 110-1b, and 110-1c for implementing the structure 110-1 of the pixel array illustrated in FIG. 4.

Referring to FIGS. 1, 2, 4, and 5A, source S, gate G and drain D of each of unit pixels 120-1a are sequentially arranged in a row direction. Each unit pixel 120-1a may include a well layer 121 for electrical isolation from adjacent unit pixels 120-1a.

Referring to FIG. 5B, unit pixels 120-1b respectively belonging to adjacent columns may be electrically isolated from each other by a shallow trench isolation (STI) 122 formed in a column direction. The STI 122 may be formed by forming a shallow trench and filling the trench with oxide or nitride. The STI 122 may prevent photocharge generated by a photodiode (not shown) included in each unit pixel 120-1b from spreading to adjacent unit pixels 120-1b.

Referring to FIG. 5C, each of unit pixels 120-1c may be electrically isolated from adjacent unit pixels 120-1c by an STI 123 formed in the row direction as well as the STI 122 formed in the column direction.

Figure 6:
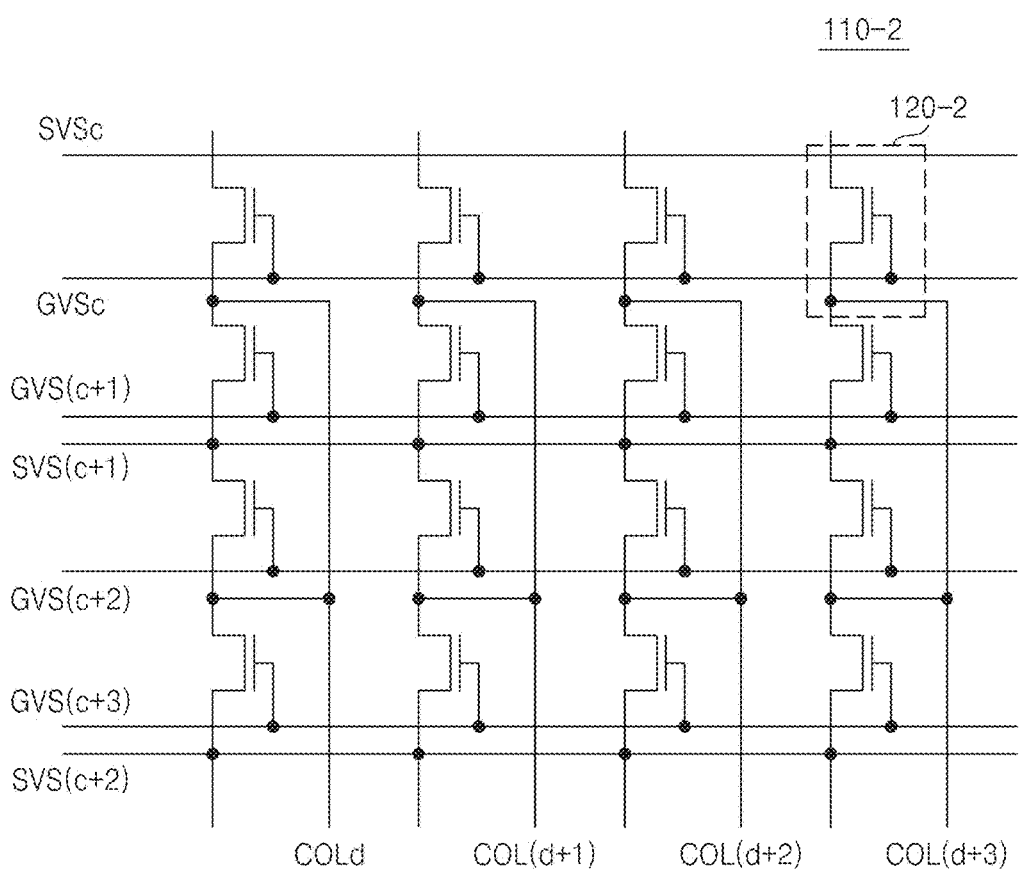
FIG. 6 is a schematic diagram of another example of the structure of the pixel array illustrated in FIG. 1.

FIG. 6 is a schematic diagram of another example of the structure of the pixel array 110 illustrated in FIG. 1.

Referring to FIGS. 1, 2, 4, and 6, in a part 110-2 of the arrangement of the pixel array 110 illustrated in FIG. 6 unlike the part 110-1 of the arrangement of the pixel array 110 illustrated in FIG. 4, unit pixels 120-2 adjacent in the column direction share a source or a drain. Single transistors respectively included in adjacent unit pixels 120-2 sharing a source receive the same signal among source voltage signals SVSc through SVS(c+2). A single transistor included in each of unit pixels 120-2 has an independent gate and thus receives one of gate voltage signals GVSc through GVS(c+ 3). A single transistor included in each of the unit pixels 120-2 may be connected to one of the column lines COLd through COL(d+3). Since the unit pixels 120-2 adjacent in the column direction share a source or a drain in the part 110-2 of the arrangement illustrated in FIG. 6, the pixel array 110 may be implemented to include more pixels per unit area or to be smaller in size.

Figure 7A:
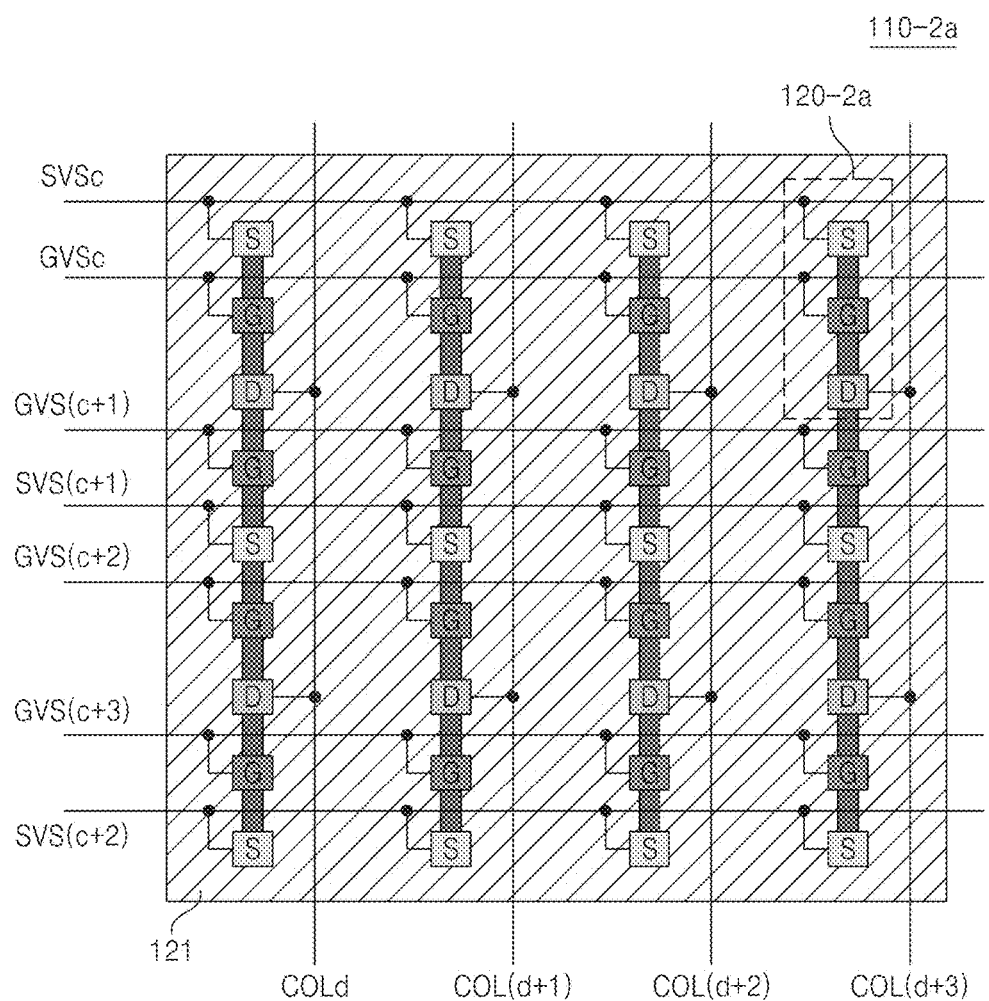
FIGS. 7A and 7B are diagrams of layouts for implementing the structure of the pixel array illustrated in FIG. 6.
Figure 7B:
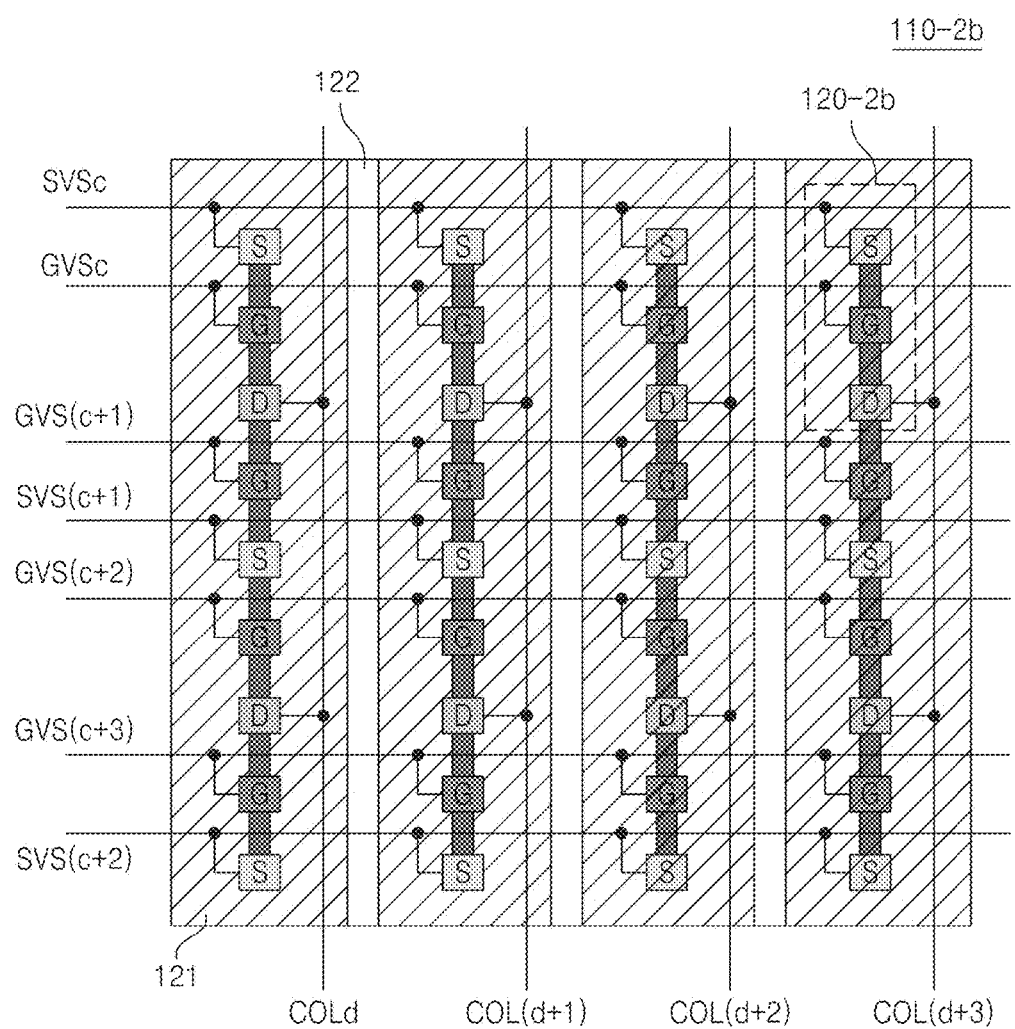

FIGS. 7A and 7B are diagrams of layouts 110-2a and 110-2b for implementing the structure 110-2 of the pixel array 110 illustrated in FIG. 6.

Referring to FIGS. 1, 2, 6, and 7A, unit pixels 120-2a adjacent in the column direction share a source S or a drain D. Each unit pixel 120-2a may include the well layer 121 for electrical isolation from adjacent unit pixels 120-2a.

Referring to FIG. 7B, unit pixels 120-2b respectively belonging to adjacent columns may be electrically isolated from each other by the STI 122 formed in the column direction.

Figure 8:
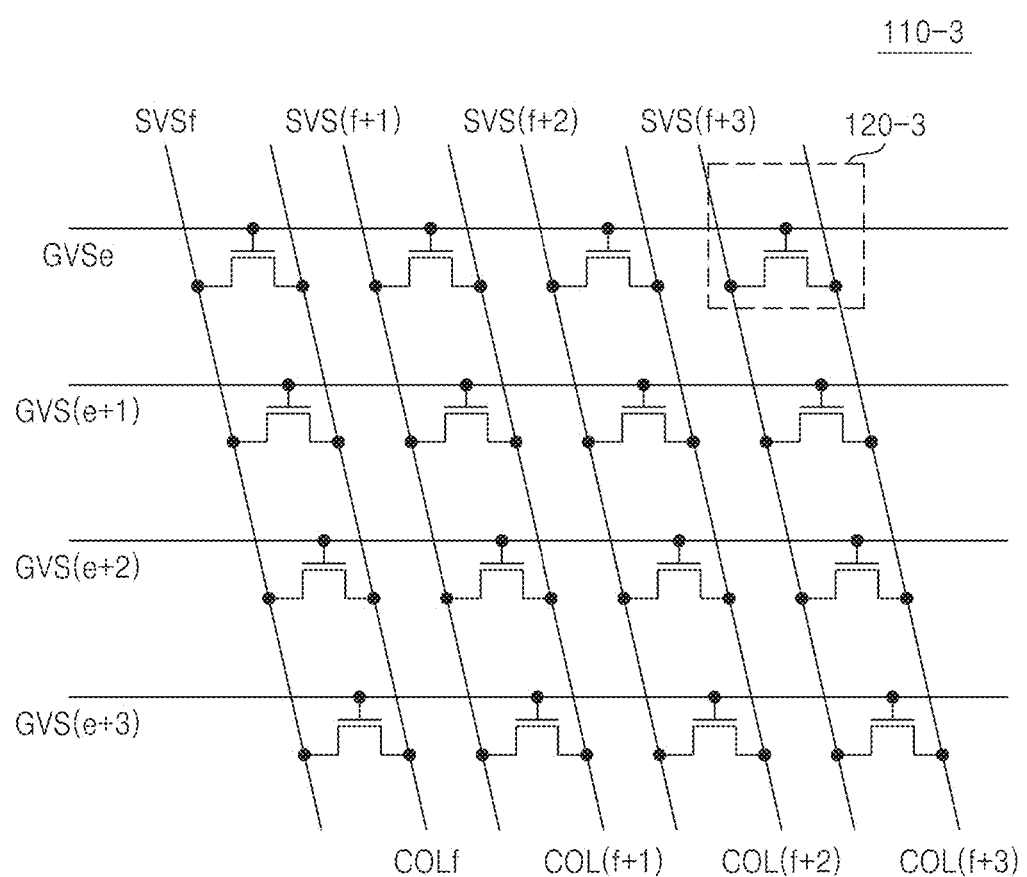
FIG. 8 is a schematic diagram of yet another example of the structure of the pixel array illustrated in FIG. 1.

FIG. 8 is a schematic diagram of yet another example of the structure of the pixel array 110 illustrated in FIG. 1.

Referring to FIGS. 1, 2, 4 through 5C, and 8, in a part 110-3 of the arrangement of the pixel array 110 illustrated in FIG. 8 unlike the part 110-1 illustrated in FIG. 4, unit pixels 120-3 adjacent in each column may receive the same signal among source voltage signals SVSf through SVS(f+3).

In the part 110-3 of the arrangement of the pixel array 110, a single transistor included in each of unit pixels 120-3 has a source and a gate, which are connected to the row driver block 160 and thus receives one of the source voltage signals SVSf through SVS(f+3) and one of gate voltage signals GVSe through GVS(e+3). The single transistor also has a drain connected to the readout block 190 and may be connected to one of column lines COLf through COL(f+3) to output a pixel signal according to the control of the row driver block 160.

Since the source and the drain of a single transistor included in each of the unit pixels 120-3 are separately and independently formed, the layouts 110-1a through 110-1c illustrated in FIGS. 5A through 5C may be used in substantially the same manner except for the above-described difference, i.e., wiring of source terminals.

Figure 9:
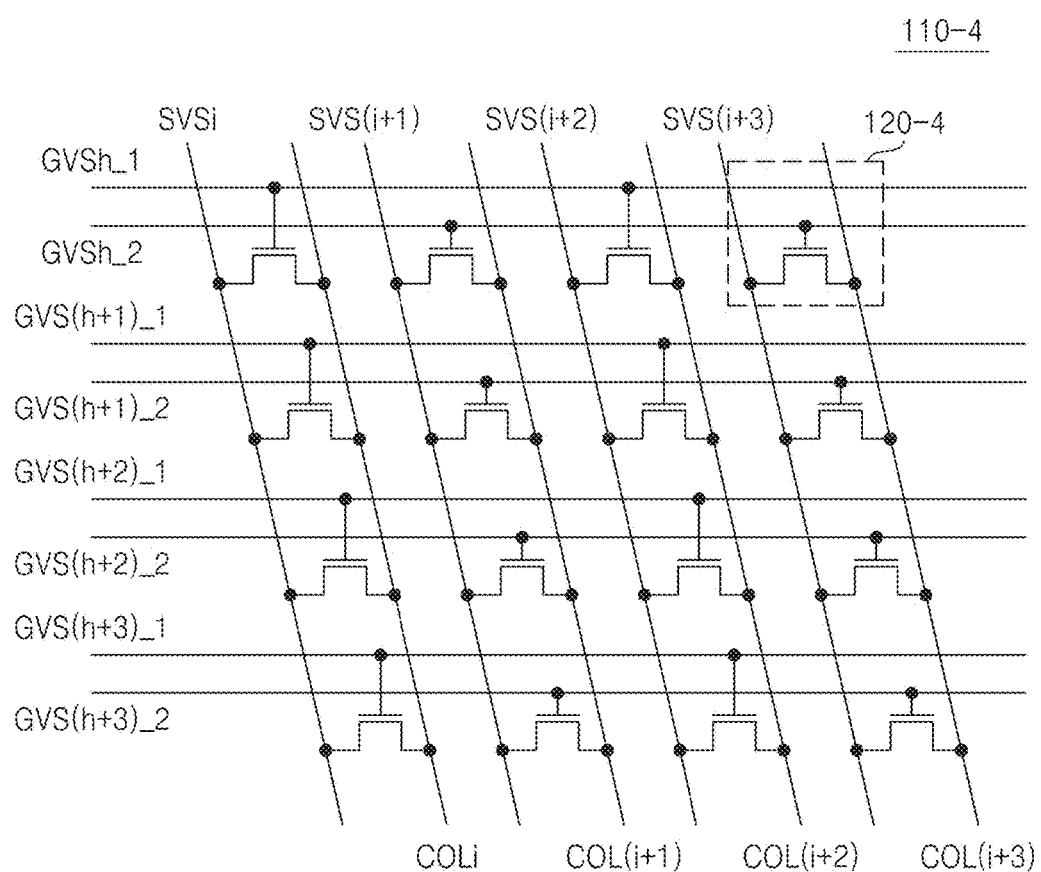
FIG. 9 is a schematic diagram of still another example of the structure of the pixel array illustrated in FIG. 1.

FIG. 9 is a schematic diagram of still another example of the structure of the pixel array 110 illustrated in FIG. 1.

Referring to FIGS. 1, 2, 4 through 5C, 8, and 9, in a part 110-4 of the arrangement of the pixel array 110 illustrated in FIG. 9 unlike the part 110-3 illustrated in FIG. 8, unit pixels 120-4 positioned at odd-numbered places along a row may receive the same signal among gate voltage signals GVSh_1 and GVS(h+1)_1 through GVS(h+3)_1 and unit pixels 120-4 positioned at even-numbered places along the row may receive the same signal among gate voltage signals GVSh_2 and GVS(h+1)_2 through GVS(h+3)_2.

Accordingly, the unit pixels 120-4 positioned at the odd-numbered places and the unit pixels 120-4 positioned at the even-numbered places may be differently controlled. For instance, while the unit pixels 120-4 positioned at the odd-numbered places are operated in the integration mode, the unit pixels 120-4 positioned at the even-numbered places may be operated in the readout mode. However, the example embodiments are not restricted to the current embodiments. Except for the above-described difference, the part 110-4 illustrated in FIG. 9 is substantially the same as the part 110-3 illustrated in FIG. 8.

Figure 10:
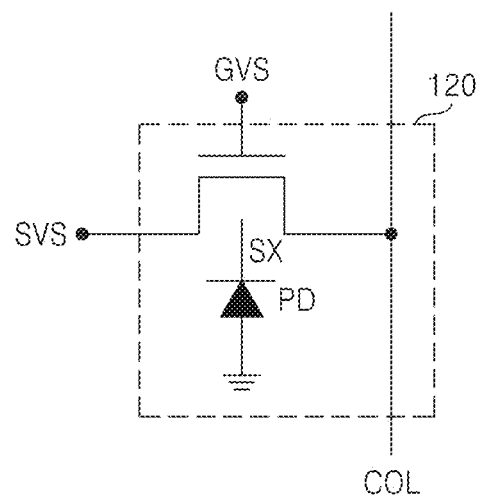
FIG. 10 is a block diagram for explaining in detail a unit pixel illustrated in FIG. 2.

FIG. 10 is a block diagram for explaining in detail a unit pixel 120 illustrated in FIG. 2.

Referring to FIGS. 1, 2, and 10, the unit pixel 120 may include a single transistor SX and a photodiode PD. For convenience' sake, it is assumed that a photoelectric conversion element is a photodiode in the embodiments illustrated in FIGS. 10 through 39, but the example embodiments is not restricted to these example embodiments. The photodiode PD has a first end connected to a ground and a second end that may be connected to or electrically disconnected from a body (or bulk) of the single transistor SX. The photodiode PD may retain photocharge generated in proportion to the intensity of light input through the lens 500.

The single transistor SX has a source and a gate, which are connected to the row driver block 160, and may thus receive a source voltage signal SVS and a gate voltage signal GVS. The unit pixel 120 may have three operation modes, i.e., an integration mode, a reset mode, and a readout mode according to the source voltage signal SVS and the gate voltage signal GVS. The source voltage signal SVS and the gate voltage signal GVS based on which the operation mode is determined will be described in detail with reference to FIG. 39 later.

In the integration mode, among photocharges (i.e., electrons and holes) generated by incident light, one type of photocharges (i.e., electrons or holes) are accumulated in the photodiode PD. In the reset mode, the photocharges accumulated in the photodiode PD are drained through a source or a drain.

In the readout mode, a pixel signal corresponding to the photocharges accumulated in the photodiode PD is output through a column line COL. The pixel signal includes an image signal and a reset signal. The image signal is a signal output in the readout mode right after the integration mode and the reset signal is a signal output in the readout mode right after the reset mode.

In the readout mode, the body voltage of the signal transistor SX may be different depending on the photocharge accumulated in the photodiode PD. The threshold voltage of the single transistor SX may vary with the body voltage. When the threshold voltage of the single transistor SX changes, the same result as obtained when a source voltage changes can be obtained. By using this principle, the unit pixel 120 may output a digital pixel signal having at least two levels.

Figure 11:
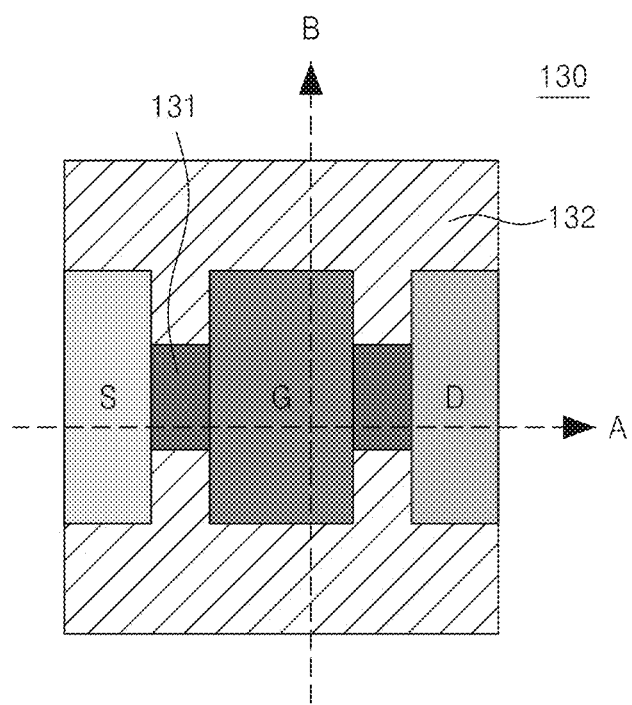
FIG. 11 is a diagram of a layout for forming the unit pixel illustrated in FIG. 2 according to some example embodiments of the inventive concepts.

FIG. 11 is a diagram of a layout 130 for forming the unit pixel 120 illustrated in FIG. 2 according to some example embodiments of the inventive concepts.

Referring to FIGS. 2 and 11, in the layout 130, a source S, a gate G, and a drain D of a single transistor are sequentially formed and a channel 131 connecting the source S and the drain D is formed. In addition, a well layer 132 for electrical isolation from adjacent unit pixels (not shown) may be included in the layout 130.

Although not shown, an STI (138 in FIGS. 13C and 13D) for electrical isolation from a unit pixel adjacent in the direction A or B may be included in the layout 130. In addition, a back-gate (B in FIGS. 13C and 13D) receiving the back-gate voltage signal BVS illustrated in FIG. 2 may be formed within the STI 138. The back-gate B may receive one of the back-gate voltage signals BVS1 through BVSn from the row driver block 160.

FIGS. 12 to 15 illustrate various examples of different layouts taken along a cross section in the A direction of the layout 130 illustrated in FIG. 11.

Figure 12:
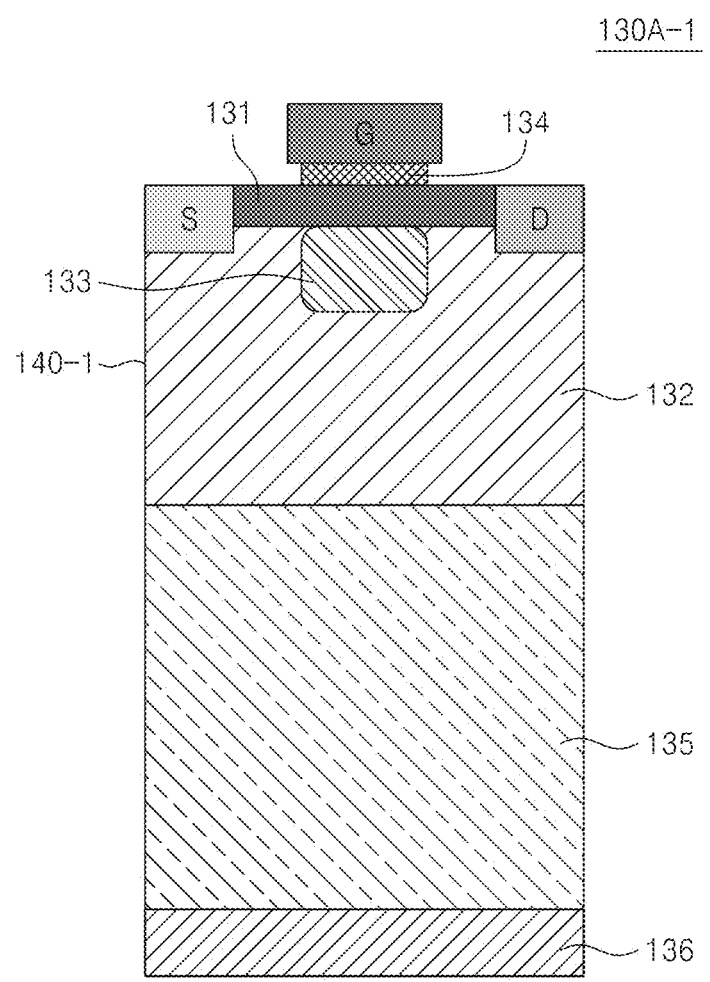
FIG. 12 is a diagram of an example of the cross-section of a semiconductor substrate taken along the direction A in the layout illustrated in FIG. 11.

FIG. 12 is a diagram of an example 130A-1 of the cross-section of a semiconductor substrate 140-1 taken along the direction A in the layout 130 illustrated in FIG. 11.

Referring to FIGS. 11 and 12, the example 130A-1 may include the source S, gate G and drain D of a single transistor, the channel 131, the well layer 132, a photodiode 133, a gate insulating layer 134, a first epitaxial layer 135, and a second epitaxial layer 136. The semiconductor substrate 140-1 may be formed based on a silicon (Si) substrate.

The source S, gate G and drain D of the single transistor may function as the terminals of the single transistor. The source S and the drain D may be formed as a high-concentration doped region by performing ion implantation. When the single transistor is a P-channel metal oxide semiconductor (PMOS) transistor, the source S and the drain D may be a P region doped with P+ type impurities. Contrarily, when the single transistor is an N-channel metal oxide semiconductor (NMOS) transistor, the source S and the drain D may be an N region doped with N+ type impurities. The gate G may be formed using poly silicon.

The channel 131 may be formed to smooth the flow of carriers between the source S and the drain D of the single transistor. The carriers are holes when the single transistor is a PMOS transistor and electrons when the single transistor is an NMOS transistor. The channel 131 is not essential but may be selectively formed. The channel 131 may be formed using Si, germanium (Ge), or SiGe. The well layer 132 may be doped with N− type impurities when the single transistor is a PMOS transistor and with P− type impurities when the single transistor is an NMOS transistor.

The photodiode 133 may be formed in the well layer 132. The photodiode 133 may be doped with N type impurities when the single transistor is a PMOS transistor and with P type impurities when the single transistor is an NMOS transistor.

The gate insulating layer 134 may be formed for insulation between the gate G and the channel 131. The gate insulating layer 134 may be formed using $SiO_2$, SiON, SiN, $Al_2O_3$, $Si_3N_4$, $Ge_xO_yN_z$, $Ge_xSi_yO_z$, or a high dielectric constant material. The high dielectric constant material may be formed using atomic layer deposition of $HfO_2$, $ZrO_2$, $Al_2O_3$, $Ta_2O_5$, hafnium silicate, zirconium silicate, or a combination thereof.

The first epitaxial layer 135 and the second epitaxial layer 136 may be formed using an epitaxial growth method. When the single transistor is a PMOS transistor, the first and second epitaxial layers 135 and 136 may be doped with P− type and P+ type impurities, respectively. Contrarily, when the single transistor is an NMOS transistor, the first and second epitaxial layers 135 and 136 may be doped with N− type and N+ type impurities, respectively.

Although not shown in FIG. 12, conducting wires for the operation of the pixel array 110, i.e., conducting wires for connection with the row driver block 160 and the readout block 190 may be formed on the source S, the gate G, and the drain to apply back side illumination (BSI) increasing the light guiding efficiency of the photodiode 133.

Figure 13A:
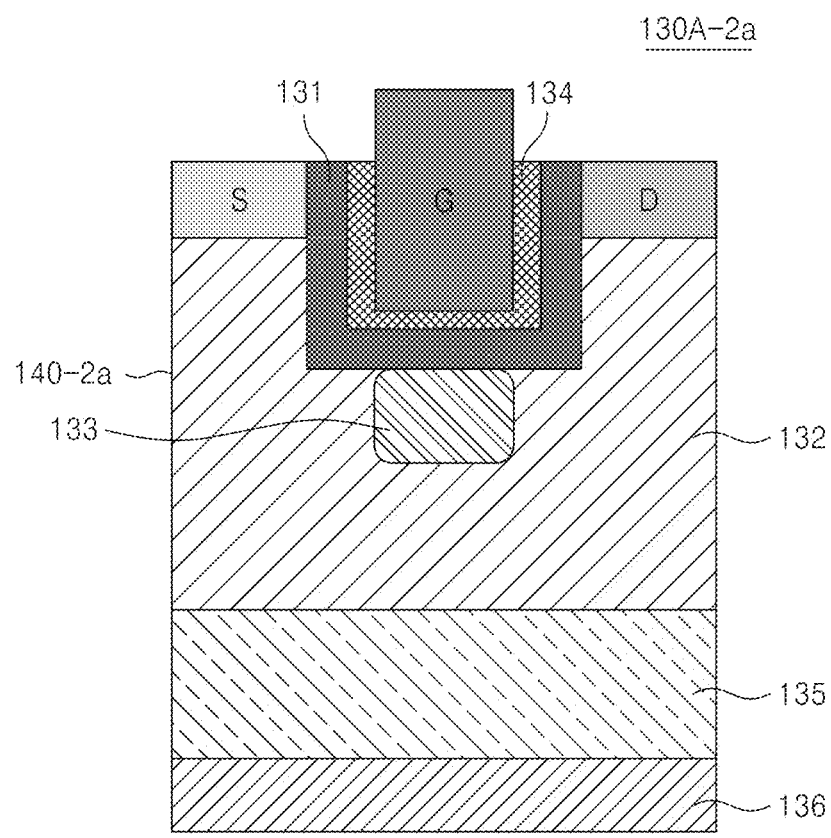
FIG. 13A is a diagram of another example of the cross-section of a semiconductor substrate taken along the direction A in the layout illustrated in FIG. 11.

FIG. 13A is a diagram of another example 130A-2a of the cross-section of a semiconductor substrate 140-2a taken along the direction A in the layout 130 illustrated in FIG. 11.

Referring to FIGS. 11 through 13A, the gate G may be embedded in the semiconductor substrate 140-2a using an etching process in the example 130A-2a. In other words, the semiconductor substrate 140-2a may have a recess gate structure.

Accordingly, the channel 131 is also embedded in the semiconductor substrate 140-2a, so that the photodiode 133 is formed within the semiconductor substrate 140-2a. Therefore, the distance from the photodiode 133 to the source S or the drain D increases. When the distance between the photodiode 133 and the source S or the drain D increases, the influence of the photodiode 133 to the channel 131 may be increased.

In particular, in the ultrasmall pixel array 110 in which the length of the gate G is 50 nm or less, the distance from the photodiode 133 to the source S or the drain D is very close, obstructing the smooth operation of the single transistor. In other words, when the length of the gate G is 50 nm or less, the distance between the photodiode 133 and the source S or the drain D is too close so that the influence of the photodiode 133 to the channel 131 decreases. As a result, a pixel signal dull to the photocharge accumulated in the photodiode 133 may be generated. Therefore, when the image sensor 100 is implemented using microscopic unit pixels, it may be preferable to form the pixel array 110 in the recess gate structure.

Except for the above-described differences, the semiconductor substrate 140-2a illustrated in FIG. 13A is substantially the same as the semiconductor substrate 140-1 illustrated in FIG. 12.

Figure 13B:
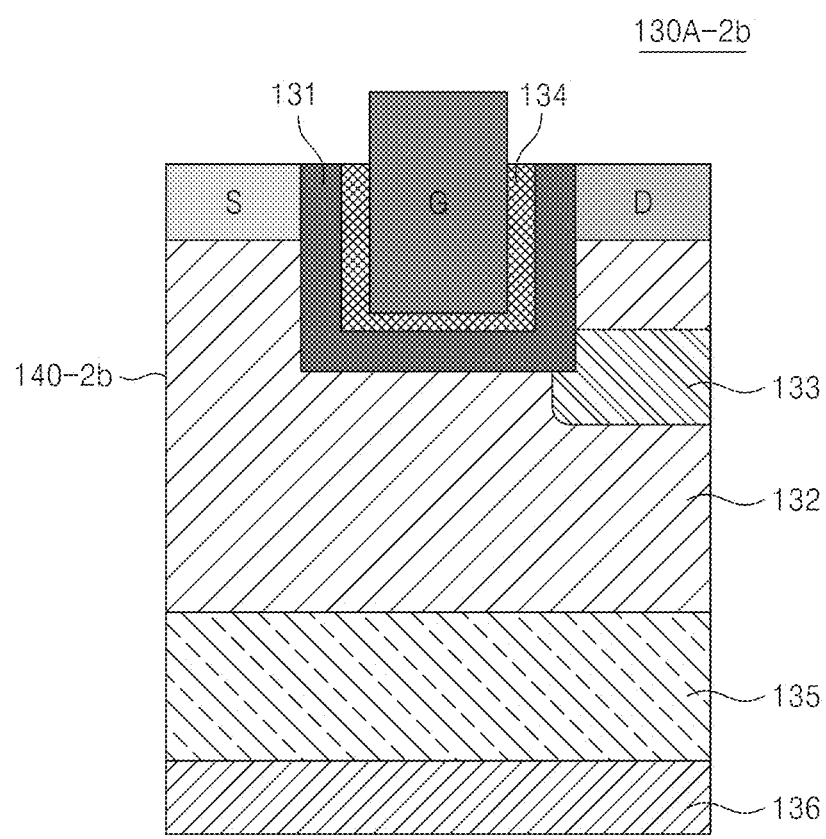
FIG. 13B is a diagram of yet another example of the cross-section of a semiconductor substrate taken along the direction A in the layout illustrated in FIG. 11.

FIG. 13B is a diagram of yet another example 130A-2b of the cross-section of a semiconductor substrate 140-2b taken along the direction A in the layout 130 illustrated in FIG. 11.

Referring to FIGS. 11 through 13B, the gate G in the example 130A-2b may be formed in the recess gate structure as in the example 130A-2a illustrated in FIG. 13B.

The photodiode 133 may be formed closer to the drain D than to the source S around the gate G. In other words, the photodiode 133 may be formed in an asymmetric structure with respect to the gate G. In other embodiments, the photodiode 133 may be formed closer to the source S than to the drain D.

When the photodiode 133 is formed as shown in FIG. 13B, the entire size of the photodiode 133 may be decreased. When the entire size of the photodiode 133 decreases, the distance between photocharge accumulated in the photodiode 133 and the channel 131 also decreases, and therefore, the influence of the photodiode 133 to the channel 131 increases according to Coulomb's law.

In particular, the recess gate structure in which the photodiode 133 is formed asymmetrically with respect to the gate G as shown in FIG. 13B in the ultra small pixel array 110 having the gate G 32 nm or less in length may have higher photoelectric conversion gain (mV/e−) and higher resistance change (%/e−) than the recess gate structure illustrated in FIG. 13A. For instance, in the pixel array 110 in which the length of the gate G is 22 nm, a single photocharge may generate a conversion voltage of about 60 mV and a resistance change of about 18%.

Figure 13C:
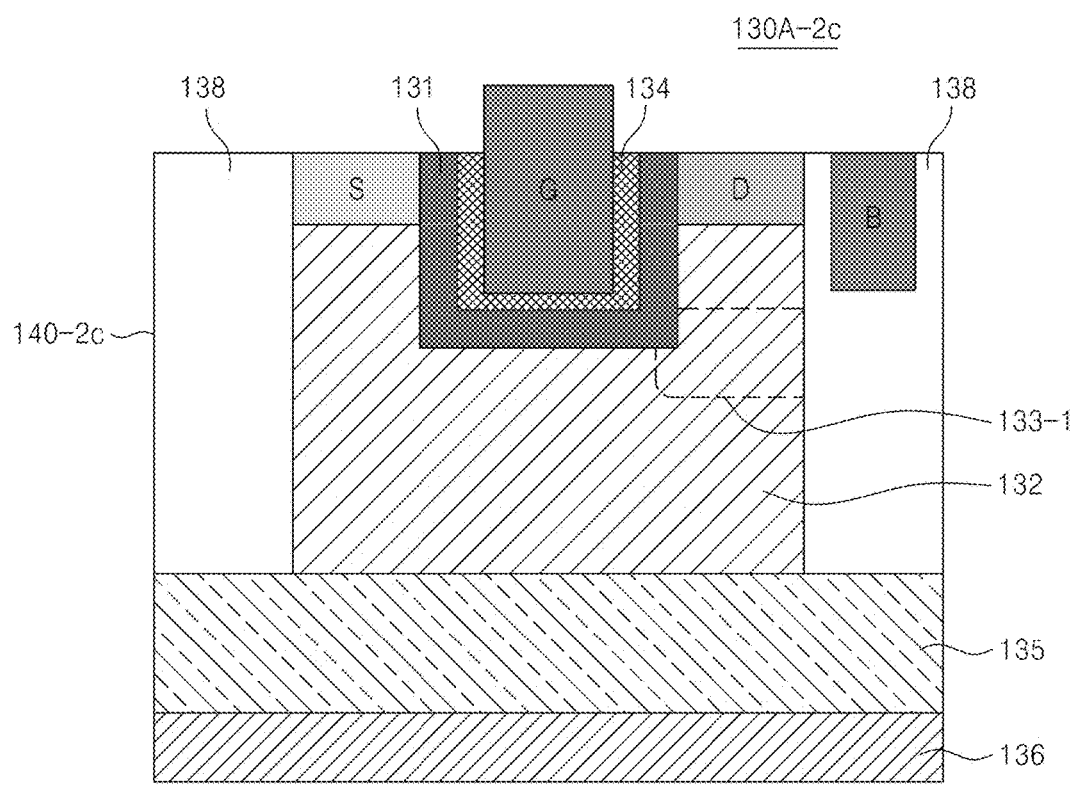
FIG. 13C is a diagram of still another example of the cross-section of a semiconductor substrate taken along the direction A in the layout illustrated in FIG. 11.

FIG. 13C is a diagram of still another example 130A-2c of the cross-section of a semiconductor substrate 140-2c taken along the direction A in the layout 130 illustrated in FIG. 11.

Referring to FIGS. 11 through 13C, the STI 138 for electrical isolation from unit pixels (not shown) adjacent in the direction A may be formed in the example 130A-2c. The back-gate B may be formed within the STI 138.

The STI 138 may be formed by forming a shallow trench and filling the trench with oxide or nitride. Thereafter, the back-gate B may be formed using poly silicon. When the back-gate B receives one of the back-gate voltage signals BVS1 through BVSn from the row driver block 160, a virtual photodiode 133-1 having a similar function to the photodiode 133 illustrated in FIG. 13B may be formed. To form the virtual photodiode 133-1, it is appropriate that the back-gate voltage signals BVS1 through BVSn have a voltage of −0.5 V or lower when the single transistor is an NMOS transistor or have a voltage of 0.5 V or higher when the single transistor is a PMOS transistor. This is just an example and the example embodiments are not restricted thereto.

When the virtual photodiode 133-1 is formed, it may perform substantially the same function as the photodiode 133 formed in the asymmetric structure with respect to the gate G in the embodiments illustrated in FIG. 13B.

Figure 13D:
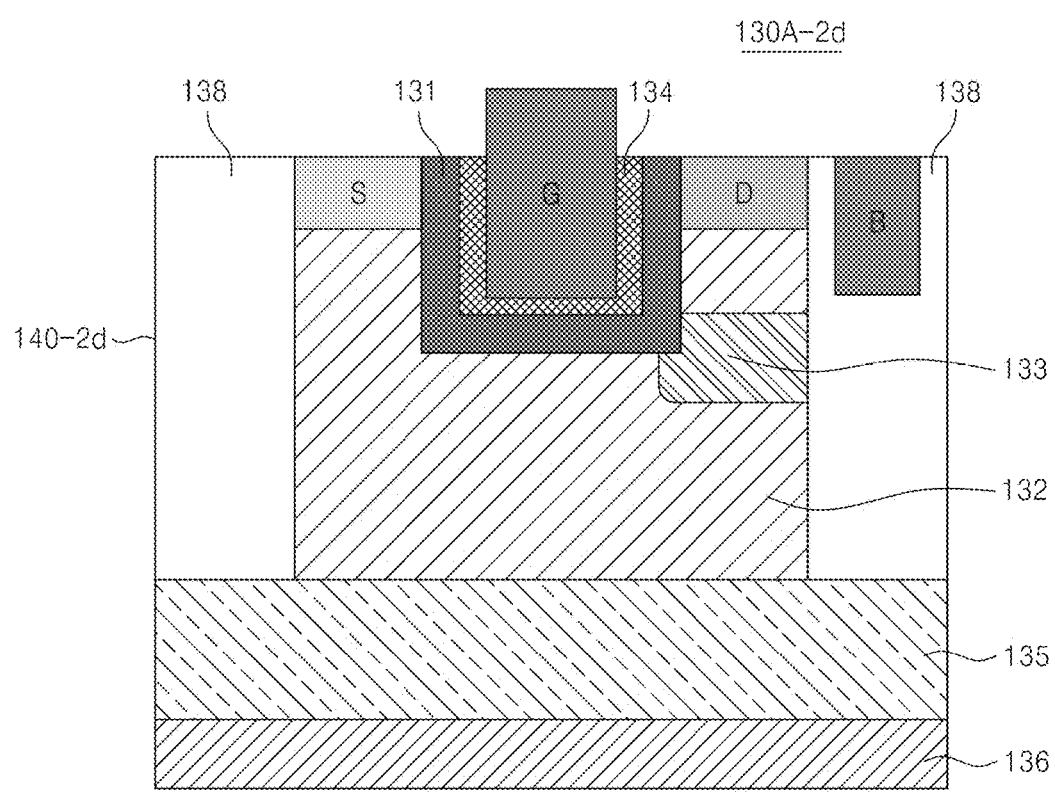
FIG. 13D is a diagram of another example of the cross-section of a semiconductor substrate taken along the direction A in the layout illustrated in FIG. 11.

FIG. 13D is a diagram of another example 130A-2d of the cross-section of a semiconductor substrate 140-2d taken along the direction A in the layout 130 illustrated in FIG. 11.

Referring to FIGS. 11 through 13D, the example 130A-2d may include the STI 138 and the back-gate B illustrated in FIG. 13C together with the photodiode 133 formed in the asymmetric structure with respect to the gate G in the embodiments illustrated in FIG. 13B. Accordingly, the influence of the photodiode 133 to the channel 131 in the example 130A-2d illustrated in FIG. 13D may be higher than those in the examples 130A-2a through 130-2c respectively illustrated in FIGS. 13A through 13C.

Figure 14:
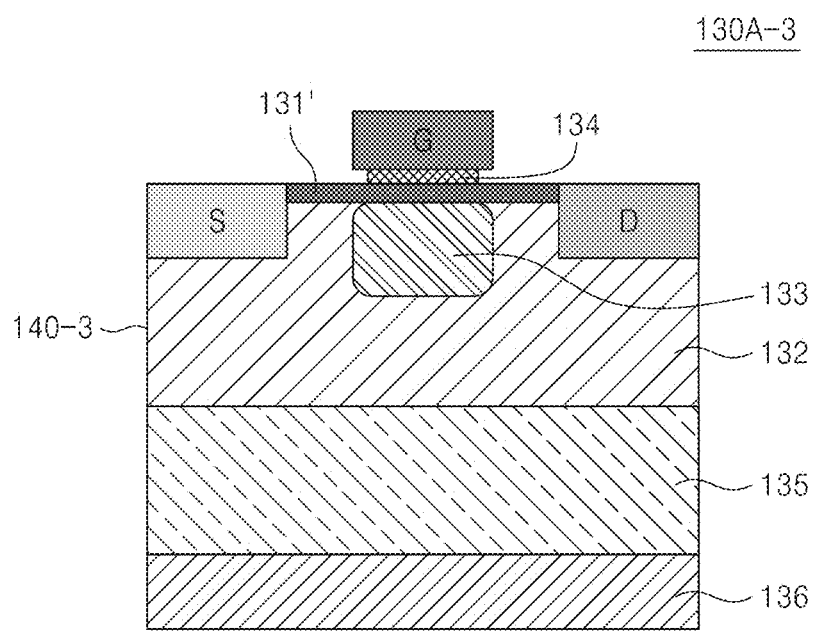
FIG. 14 is a diagram of yet another example of the cross-section of a semiconductor substrate taken along the direction A in the layout illustrated in FIG. 11.

FIG. 14 is a diagram of yet another example 130A-3 of the cross-section of a semiconductor substrate 140-3 taken along the direction A in the layout 130 illustrated in FIG. 11.

Referring to FIGS. 11 through 14, a channel 131' may be formed using Germanium Ge or SiGe instead of Si in the example 130A-3. In other words, the semiconductor substrate 140-3 may have a Ge channel structure.

When the channel 131' is formed using Ge or SiGe, the influence of the photodiode 133 to the channel 131' may be increased as in the semiconductor substrates 140-2a through 140-2d respectively illustrated in FIGS. 13A through 13D. In other words, the photodiode 133 stores photocharge in the channel 131' that is localized, so that the influence of the photodiode 133 to the channel 131' is increased.

Except for the above-described difference, the semiconductor substrate 140-3 is substantially the same as the semiconductor substrate 140-1 illustrated in FIG. 12.

Figure 15:
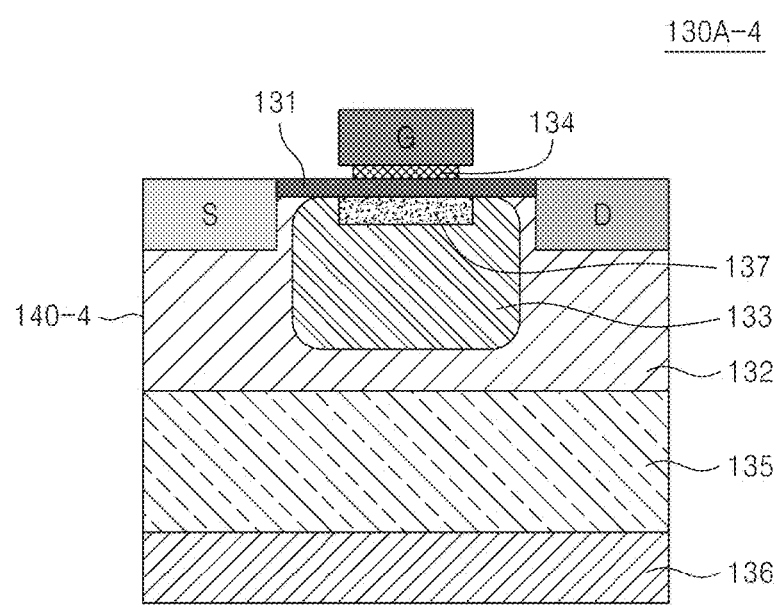
FIG. 15 is a diagram of still another example of the cross-section of a semiconductor substrate taken along the direction A in the layout illustrated in FIG. 11.

FIG. 15 is a diagram of still another example 130A-4 of the cross-section of a semiconductor substrate 140-4 taken along the direction A in the layout 130 illustrated in FIG. 11.

Referring to FIGS. 11 through 15, the channel 131 may be formed using Si in the example 130A-4. The photodiode 133 may be a P or N doped Si region. An internal photodiode 137 may be formed between the photodiode 133 and the channel 131 using Ge or SiGe.

When the internal photodiode 137 is formed adjacent to the photodiode 133, the influence of the photodiode 133 to the channel 131 is increased as in the semiconductor substrate 140-3 illustrated in FIG. 14. In other words, the photodiode 133 stores photocharge in the internal photodiode 137, so that the influence of the photodiode 133 to the channel 131 is increased.

Except for the above-described difference, the semiconductor substrate 140-4 is substantially the same as the semiconductor substrate 140-1 illustrated in FIG. 12.

Figure 16:
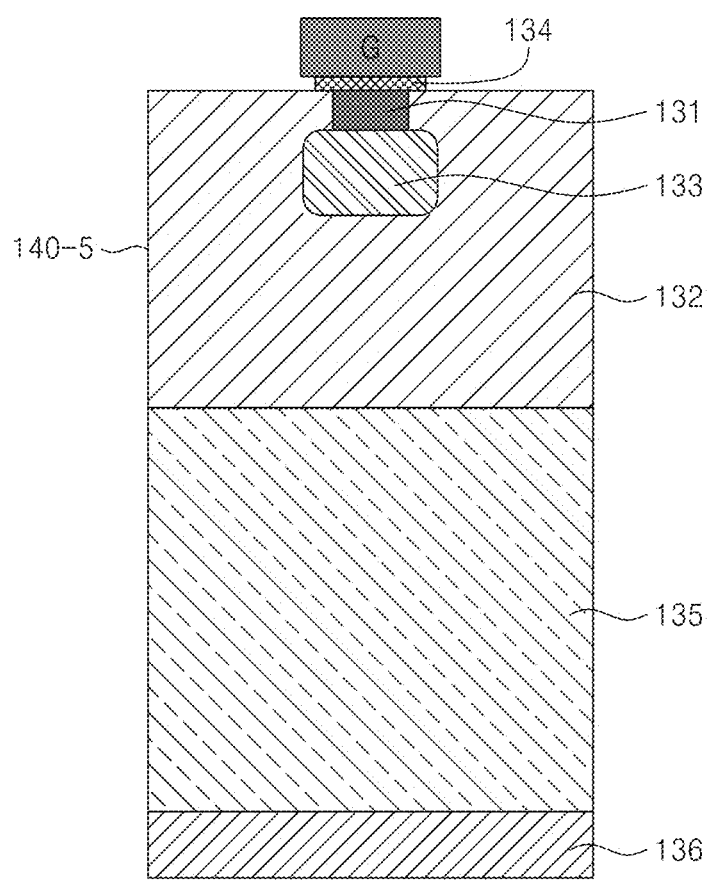
FIG. 16 is a diagram of an example of the cross-section of a semiconductor substrate taken along the direction B in the layout illustrated in FIG. 11.
Figure 17:
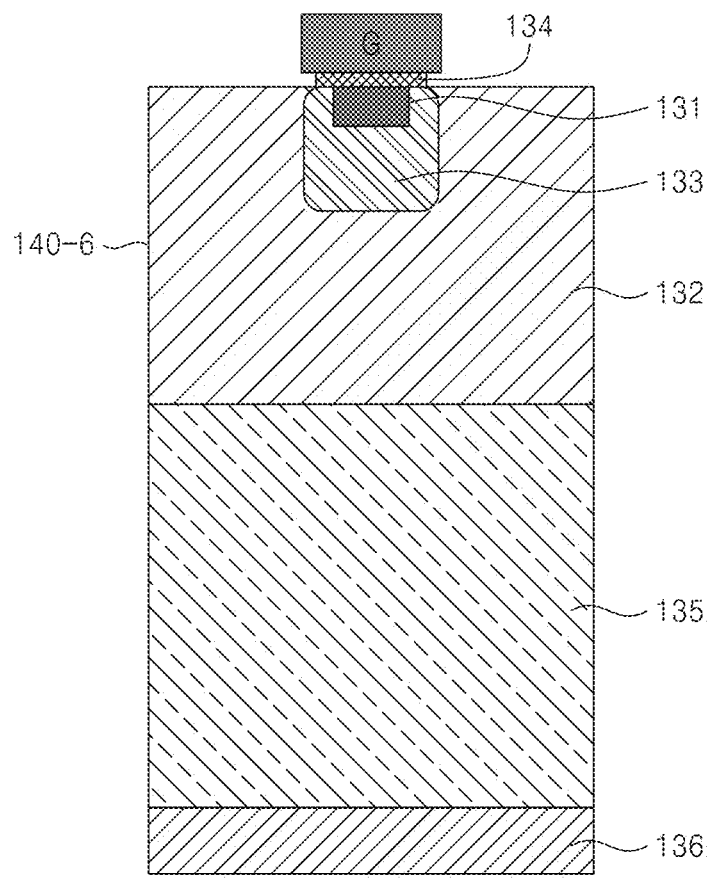
FIG. 17 is a diagram of another example of the cross-section of a semiconductor substrate taken along the direction B in the layout illustrated in FIG. 11.
Figure 18:
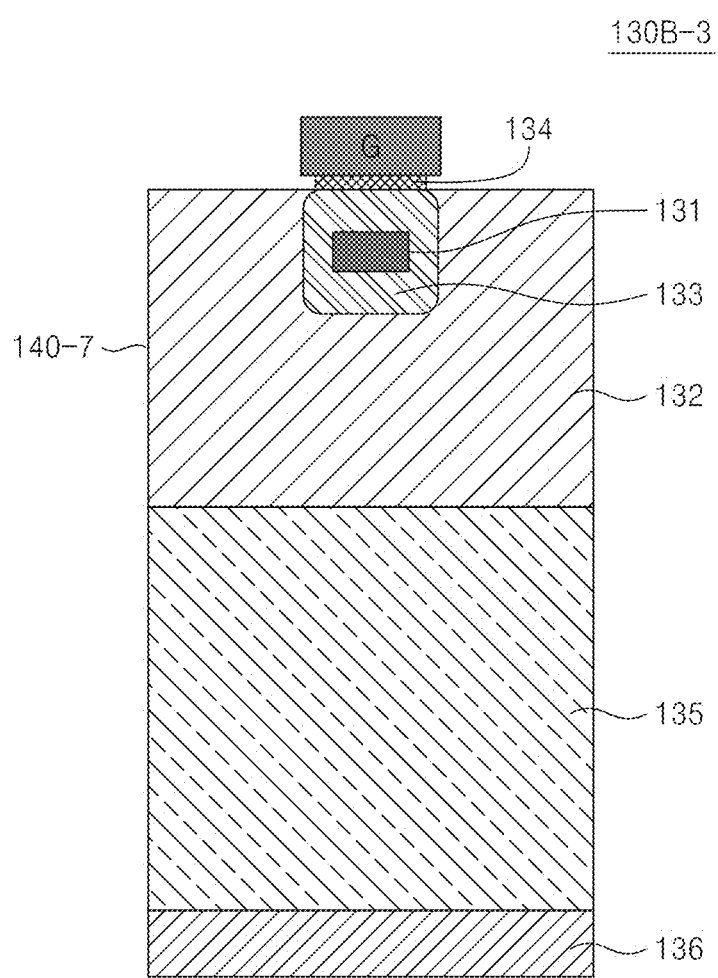
FIG. 18 is a diagram of yet another example of the cross-section of a semiconductor substrate taken along the direction B in the layout illustrated in FIG. 11.

FIGS. 16 to 18 illustrate various examples of different layouts taken along a cross section in the B direction of the layout 130 illustrated in FIG. 11.

FIG. 16 is a diagram of an example 130B-1 of the cross-section of a semiconductor substrate 140-5 taken along the direction B in the layout 130 illustrated in FIG. 11.

Referring to FIGS. 11 through 16, the gate G of the single transistor, the channel 131, the well layer 132, the photodiode 133, the gate insulating layer 134, the first epitaxial layer 135, and the second epitaxial layer 136 in the example 130B-1 are substantially the same as those illustrated in FIG. 12.

Referring to FIG. 16, one side of the channel 131 may contact the gate insulating layer 134 and another side of the channel 131 may contact the photodiode 133. The remaining sides of the channel 131 may contact the well layer 132.

The source S, gate G and drain D of the single transistor, the channel 131, the well layer 132, the photodiode 133, the gate insulating layer 134, the first epitaxial layer 135, and the second epitaxial layer 136 illustrated in FIG. 12 are applied in the same manner to the example 130B-1 illustrated in FIG. 16.

FIG. 17 is a diagram of another example 130B-2 of the cross-section of a semiconductor substrate 140-6 taken along the direction B in the layout 130 illustrated in FIG. 11.

Referring to FIGS. 11 through 17, one side of the channel 131 contacts the gate insulating layer 134 and three other adjacent sides of the channel 131 contact the photodiode 133 in the example 130B-2 illustrated in FIG. 17.

Except for the above-described difference, the semiconductor substrate 140-6 is substantially the same as the semiconductor substrate 140-5 illustrated in FIG. 16.

FIG. 18 is a diagram of yet another example 130B-3 of the cross-section of a semiconductor substrate 140-7 taken along the direction B in the layout 130 illustrated in FIG. 11.

Referring to FIGS. 11 through 18, four sides of the channel 131 contact the photodiode 133 in the example 130B-3. Except for this difference, the semiconductor substrate 140-7 illustrated in FIG. 18 is substantially the same as the semiconductor substrate 140-5 illustrated in FIG. 16.

Figure 19:
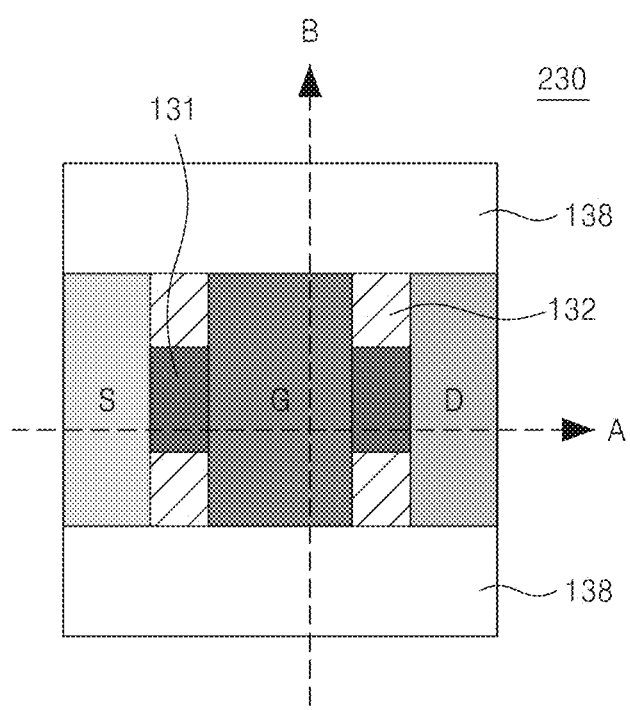
FIG. 19 is a diagram of a layout for forming the unit pixel illustrated in FIG. 2 according to other example embodiments of the inventive concepts.

FIG. 19 is a diagram of a layout 230 for forming the unit pixel 120 illustrated in FIG. 2 according to other example embodiments of the inventive concepts.

Referring to FIGS. 2, 11, and 19, the source S, gate G and drain D of the single transistor, the channel 131, and the well layer 132 are formed in the layout 230 as in the layout 130 illustrated in FIG. 11. The STI 138 may also be formed for electrical isolation from unit pixels (not shown) adjacent in the direction B in the layout 230.

A cross-section of a semiconductor substrate taken along the direction A in the layout 230 may correspond to one of the cross-sections 130A-1 through 130A-4 taken along the direction A in the layout 130.

Figure 20:
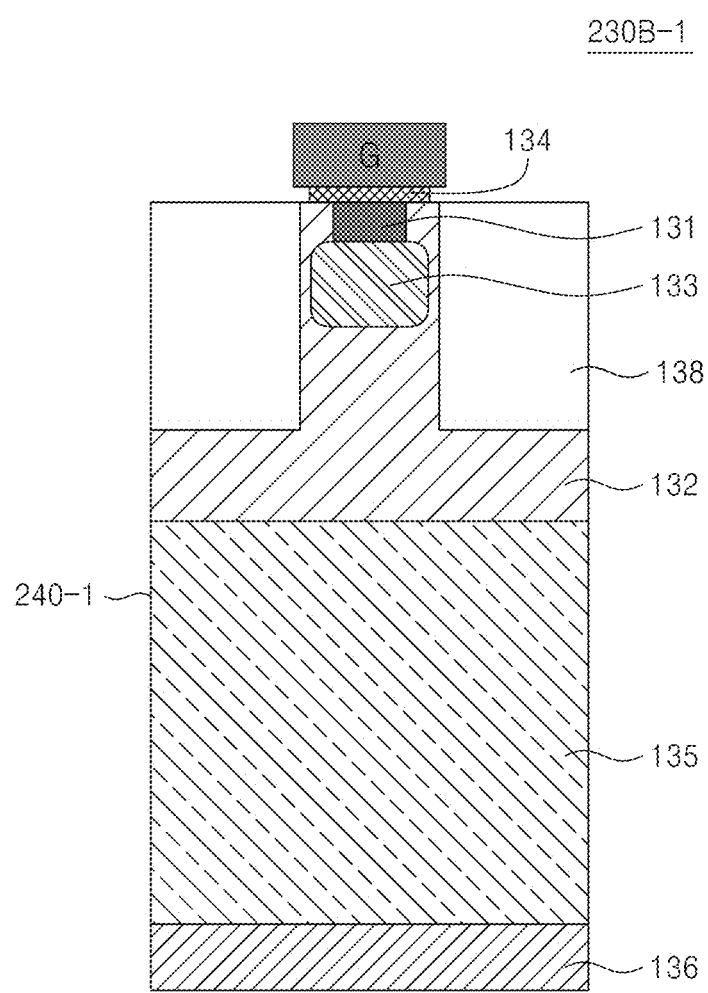
FIG. 20 is a diagram of an example of the cross-section of a semiconductor substrate taken along the direction B in the layout illustrated in FIG. 19.
Figure 21:
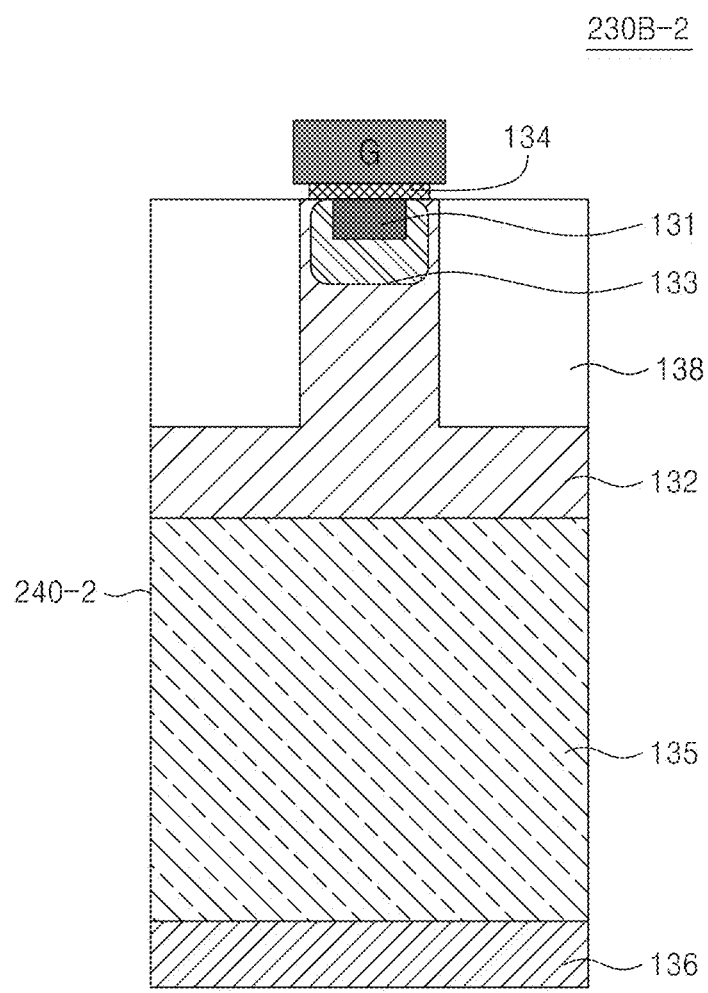
FIG. 21 is a diagram of another example of the cross-section of a semiconductor substrate taken along the direction B in the layout illustrated in FIG. 19.
Figure 22:
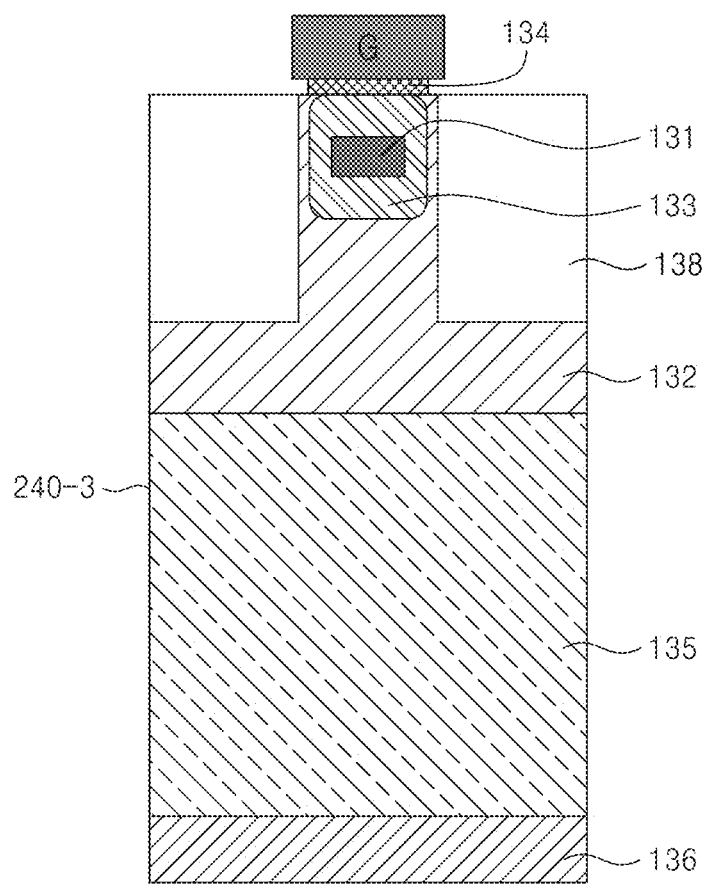
FIG. 22 is a diagram of yet another example of the cross-section of a semiconductor substrate taken along the direction B in the layout illustrated in FIG. 19.

FIG. 20 is a diagram of an example 230B-1 of the cross-section of a semiconductor substrate 240-1 taken along the direction B in the layout 230 illustrated in FIG. 19. FIG. 21 is a diagram of another example 230B-2 of the cross-section of a semiconductor substrate 240-2 taken along the direction B in the layout 230 illustrated in FIG. 19. FIG. 22 is a diagram of yet another example 230B-3 of the cross-section of a semiconductor substrate 240-3 taken along the direction B in the layout 230 illustrated in FIG. 19.

Referring to FIGS. 12, 16 through 18, and 19 through 22, the gate G of the single transistor, the channel 131, the well layer 132, the photodiode 133, the gate insulating layer 134, the first epitaxial layer 135, and the second epitaxial layer 136 in the examples 230B-1 through 230B-3 are substantially the same as those illustrated in FIG. 12.

In the examples 230B-1 through 230B-3 respectively illustrated in FIGS. 20 through 22, the STI 138 may be formed at both sides of the photodiode 133. The STI 138 effectively prevents photocharge generated in the photodiode 133 from spreading to other adjacent unit pixels (not shown). The positional relationship among the channel 131, the photodiode 133, and the gate insulating layer 134 in the examples 230B-1 through 230B-3 illustrated in FIGS. 20 through 22 is substantially the same as that in the examples 130B-1 through 130B-3 respectively illustrated in FIGS. 16 through 18.

Figure 23:
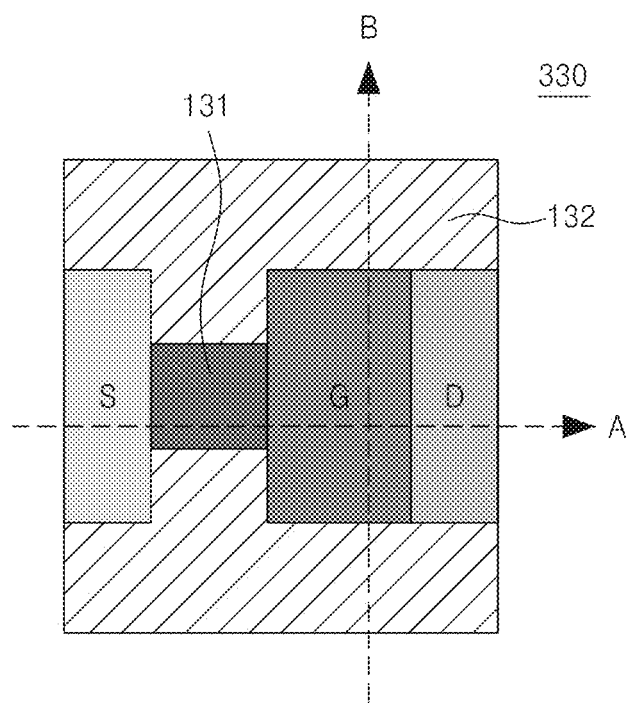
FIG. 23 is a diagram of a layout for forming the unit pixel illustrated in FIG. 2 according to further example embodiments of the inventive concepts.

FIG. 23 is a diagram of a layout 330 for forming the unit pixel 120 illustrated in FIG. 2 according to further example embodiments of the inventive concepts.

Referring to FIGS. 2, 11, and 23, like the layout 130 illustrated in FIG. 11, the layout 330 includes the source S, gate G and drain D of a single transistor, the channel 131, and the well layer 132. In the layout 330, the gate G may be formed adjacent to the drain D. A cross-section of a semiconductor substrate taken along the direction B in the layout 330 may correspond to one of the cross-sections 130B-1 through 130B-3 respectively illustrated in FIGS. 16 through 18.

Figure 24:
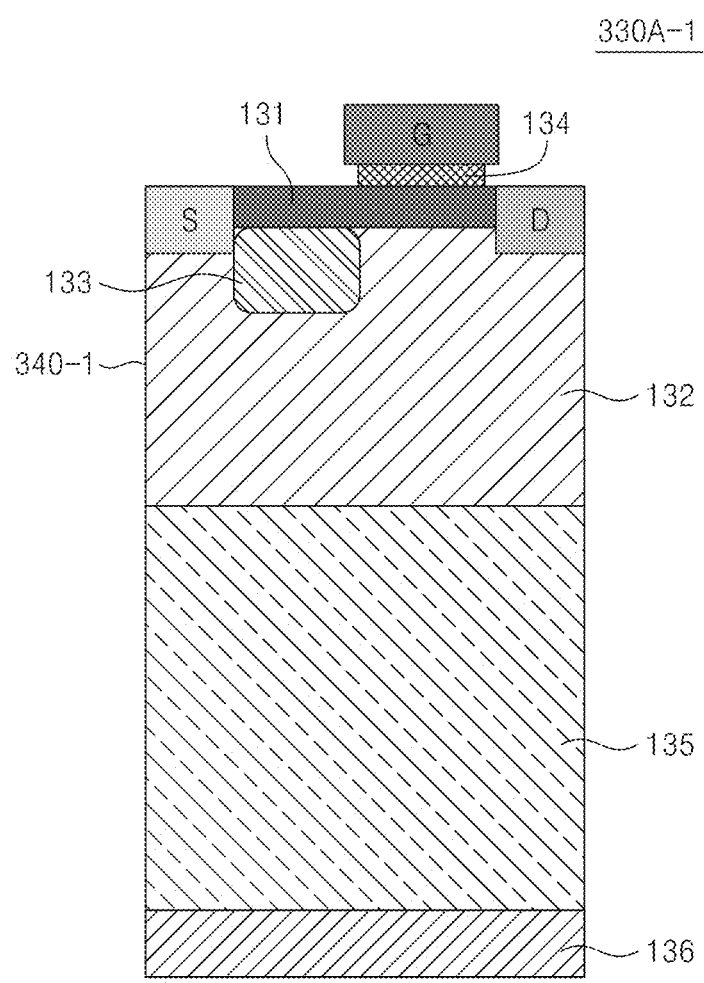
FIG. 24 is a diagram of an example of the cross-section of a semiconductor substrate taken along the direction A in the layout illustrated in FIG. 23.
Figure 25:
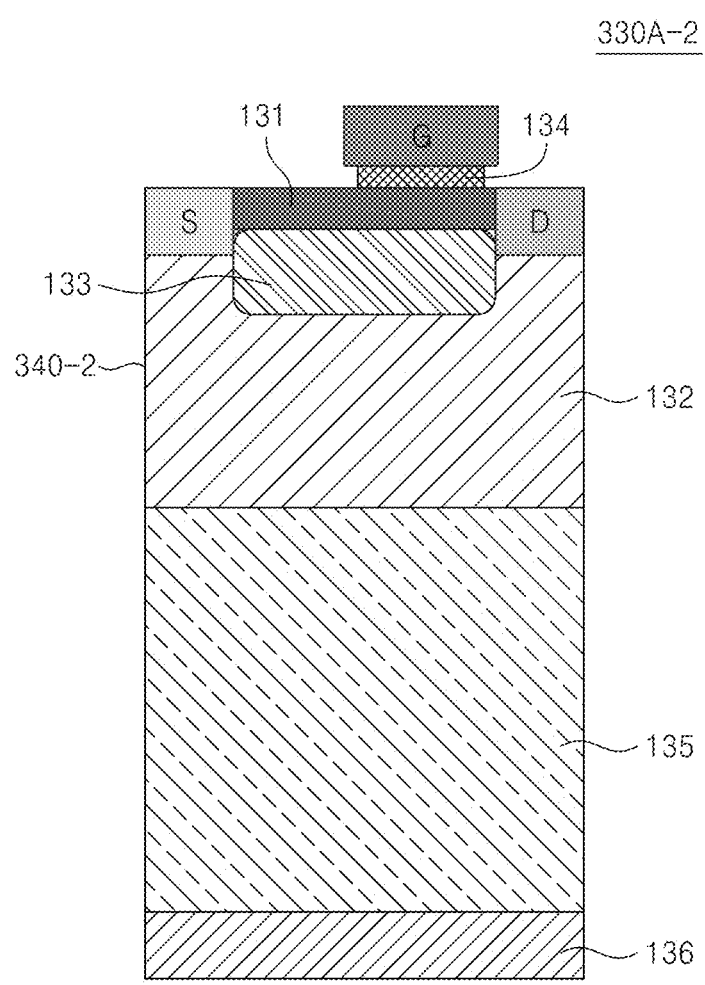
FIG. 25 is a diagram of another example of the cross-section of a semiconductor substrate taken along the direction A in the layout illustrated in FIG. 23.

FIG. 24 is a diagram of an example 330A-1 of the cross-section of a semiconductor substrate 340-1 taken along the direction A in the layout 330 illustrated in FIG. 23. FIG. 25 is a diagram of another example 330A-2 of the cross-section of a semiconductor substrate 340-2 taken along the direction A in the layout 330 illustrated in FIG. 23.

Referring to FIGS. 12 and 23 through 25, the source S, gate G and drain D of the single transistor, the channel 131, the well layer 132, the photodiode 133, the gate insulating layer 134, the first epitaxial layer 135, and the second epitaxial layer 136 in the examples 330A-1 and 330A-2 are substantially the same as those illustrated in FIG. 12.

In the examples 330A-1 and 330A-2, the gate G of the single transistor may be formed adjacent to the drain D.

In the example 330A-1 illustrated in FIG. 24, the photodiode 133 may be formed shorter than the channel 131 and adjacent to the source S. In other words, the photodiode 133 and the gate G alternate in position, minimizing the influence of the gate G during the readout mode. As a result, the influence of photocharge accumulated in the photodiode 133 to the channel 131 increases. In addition, when a reset voltage is applied to the drain D in the reset mode, a reset operation is allowed to be efficiently performed by applying a particular voltage to the gate G adjacent to the drain D.

In the example 330A-2 illustrated in FIG. 25, the photodiode 133 is formed in almost the same length as the channel 131, so that light guiding efficiency is higher than in the example 330A-1 illustrated in FIG. 24.

Figure 26:
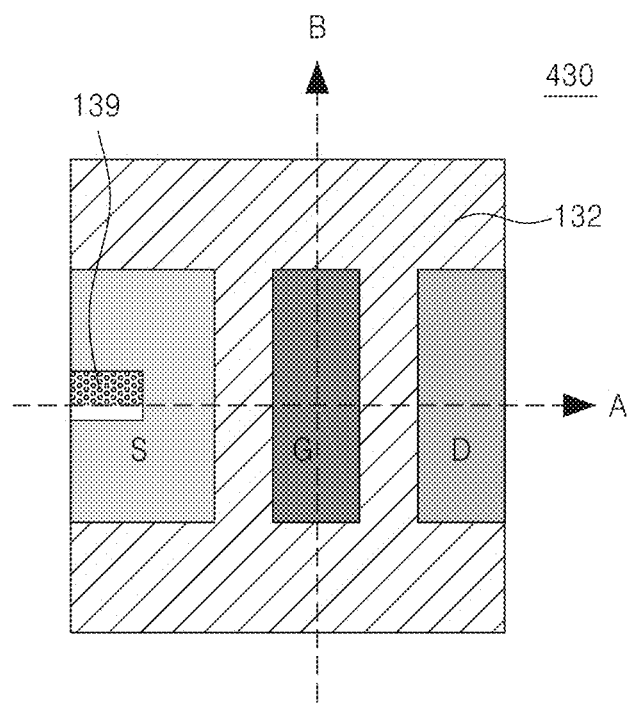
FIG. 26 is a diagram of a layout for forming the unit pixel illustrated in FIG. 2 according to other example embodiments of the inventive concepts.

FIG. 26 is a diagram of a layout 430 for forming the unit pixel 120 illustrated in FIG. 2 according to other example embodiments of the inventive concepts.

Referring to FIGS. 2, 11, and 26, like the layout 130 illustrated in FIG. 11, the layout 430 includes the source S, gate G and drain D of a single transistor, the channel 131, and the well layer 132. In the layout 430, a reset terminal 139 may be formed in the source S.

A cross-section of a semiconductor substrate taken along the direction B in the layout 430 may correspond to one of the cross-sections 130B-1 through 130B-3 respectively illustrated in FIGS. 16 through 18.

Although not shown in FIG. 26, the STI (138 in FIGS. 28C and 28D) for electrical isolation from unit pixels (not shown) adjacent in the direction A or B may be formed. In addition, the back-gate (B in FIGS. 28C and 28D) receiving the back-gate voltage signal BVS illustrated in FIG. 2 may be formed in the STI 138. The back-gate B may receive one of the back-gate voltage signals BVS1 through BVSn from the row driver block 160. When the layout 430 includes an STI formed in the direction A, a cross-section taken along the direction B in the layout 430 may correspond to one of the cross-sections 230B-1 through 230B-3 respectively illustrated in FIGS. 20 through 22.

Figure 27:
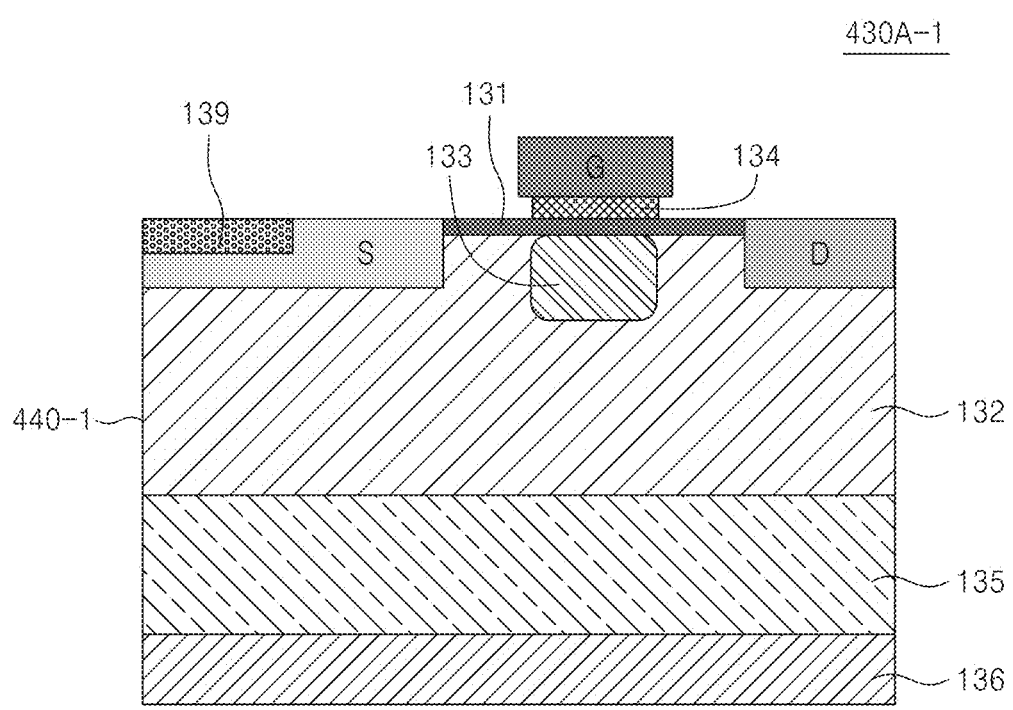
FIG. 27 is a diagram of an example of the cross-section of a semiconductor substrate taken along the direction A in the layout illustrated in FIG. 26.
Figure 28A:
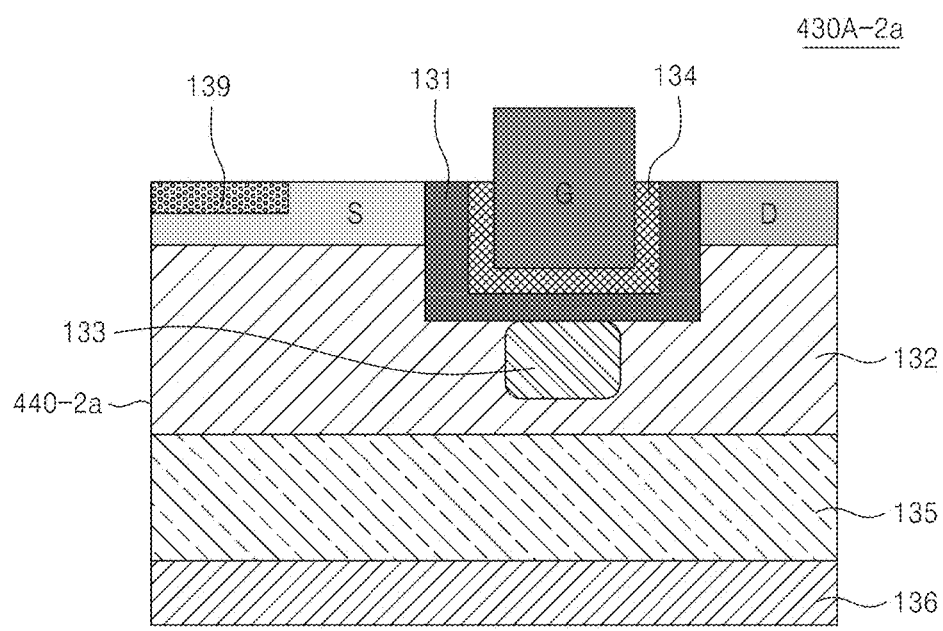
FIG. 28A is a diagram of another example of the cross-section of a semiconductor substrate taken along the direction A in the layout illustrated in FIG. 26.
Figure 28B:
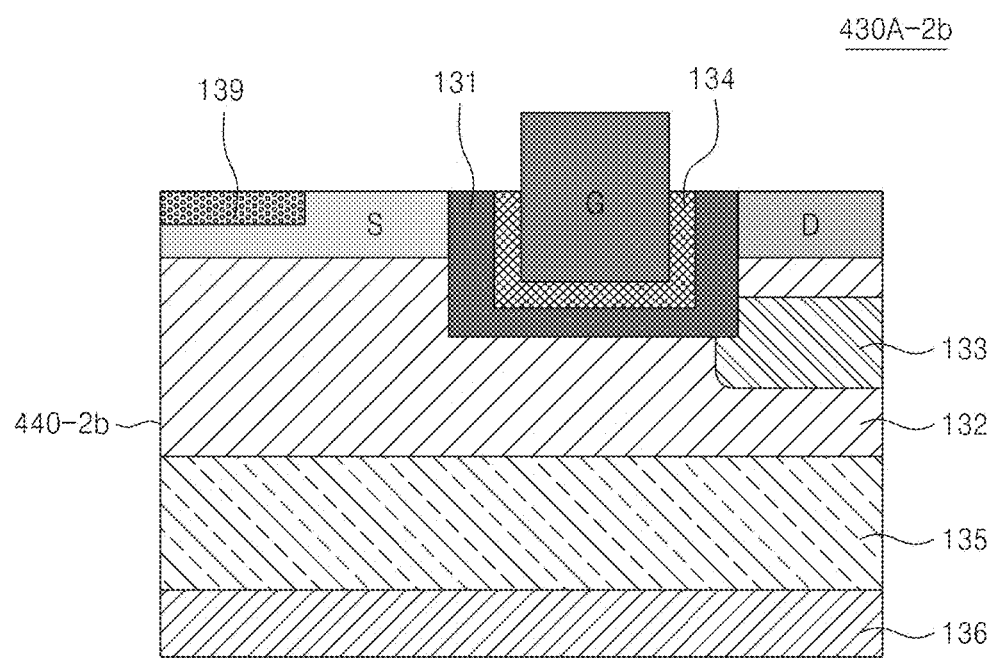
FIG. 28B is a diagram of yet another example of the cross-section of a semiconductor substrate taken along the direction A in the layout illustrated in FIG. 26.
Figure 28C:
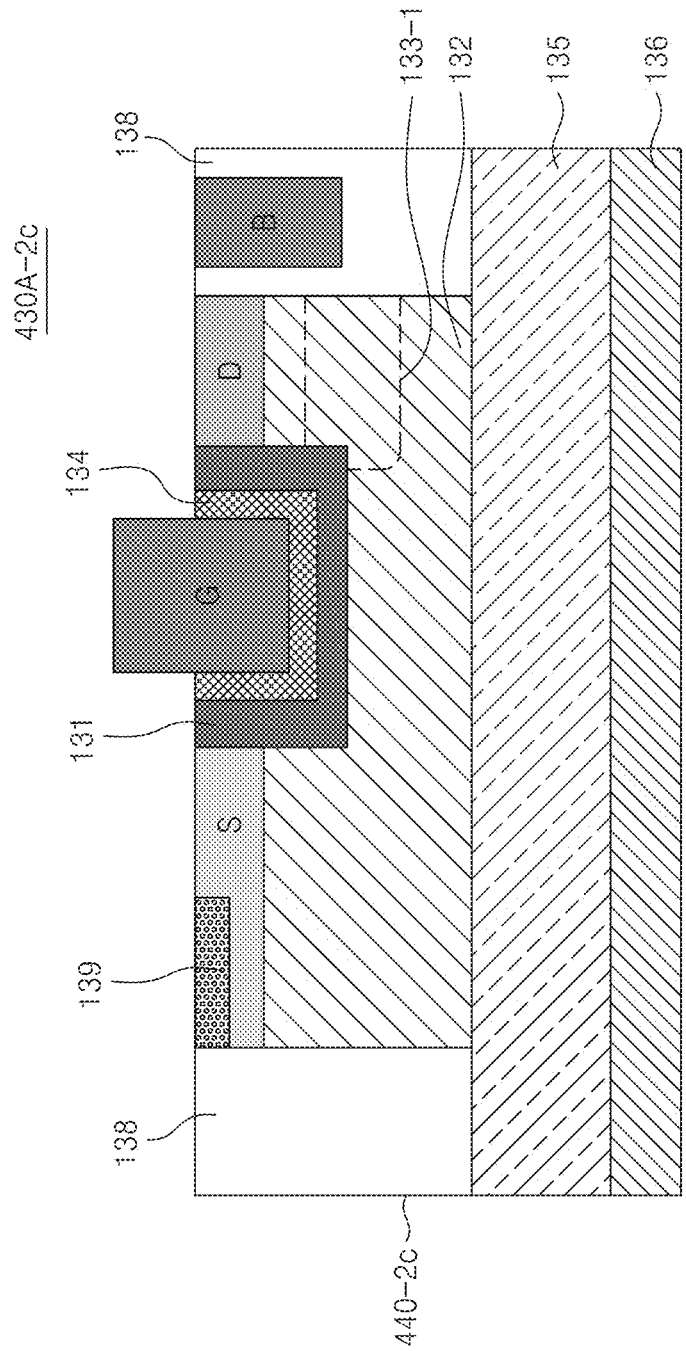
FIG. 28C is a diagram of still another example of the cross-section of a semiconductor substrate taken along the direction A in the layout illustrated in FIG. 26.
Figure 29:
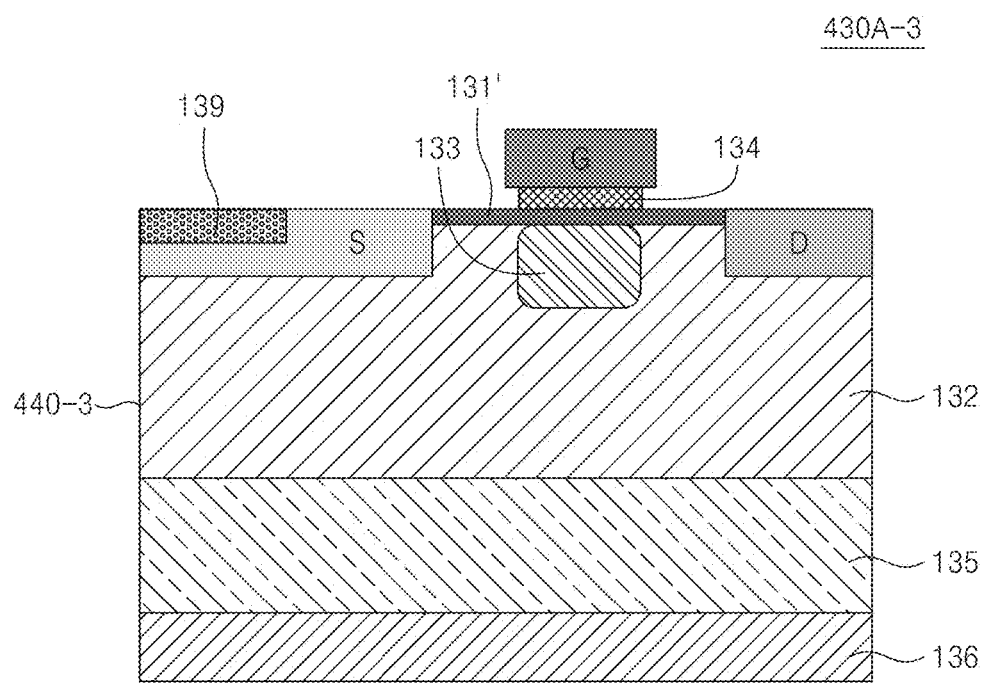
FIG. 29 is a diagram of yet another example of the cross-section of a semiconductor substrate taken along the direction A in the layout illustrated in FIG. 26.
Figure 30:
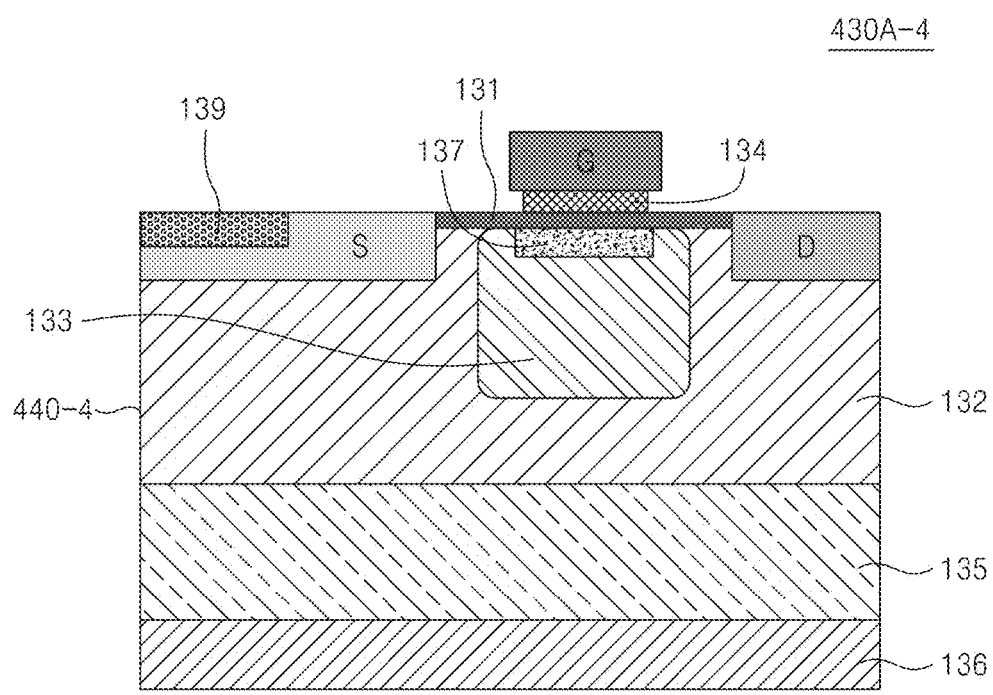
FIG. 30 is a diagram of still another example of the cross-section of a semiconductor substrate taken along the direction A in the layout illustrated in FIG. 26.

FIG. 27 is a diagram of an example 430A-1 of the cross-section of a semiconductor substrate 440-1 taken along the direction A in the layout 430 illustrated in FIG. 26. FIG. 28A is a diagram of another example 430A-2a of the cross-section of a semiconductor substrate 440-2a taken along the direction A in the layout 430 illustrated in FIG. 26. FIG. 28B is a diagram of yet another example 430A-2b of the cross-section of a semiconductor substrate 440-2b taken along the direction A in the layout 430 illustrated in FIG. 26. FIG. 28C is a diagram of still another example 430A-2c of the cross-section of a semiconductor substrate 440-2c taken along the direction A in the layout 430 illustrated in FIG. 26. FIG. 28D is a diagram of another example 430A-2d of the cross-section of a semiconductor substrate 440-2d taken along the direction A in the layout 430 illustrated in FIG. 26. FIG. 29 is a diagram of yet another example 430A-3 of the cross-section of a semiconductor substrate 440-3 taken along the direction A in the layout 430 illustrated in FIG. 26. FIG. 30 is a diagram of still another example 430A-4 of the cross-section of a semiconductor substrate 440-4 taken along the direction A in the layout 430 illustrated in FIG. 26.

Referring to FIGS. 12 through 15 and 26 through 30, the source S, gate G, drain D and back-gate B of the single transistor, the channel 131, the well layer 132, the photodiode 133, the gate insulating layer 134, the first epitaxial layer 135, the second epitaxial layer 136, the internal photodiode 137, and the STI 138 in the examples 430A-1 through 430A-4 are substantially the same as those illustrated in FIGS. 12 through 15, respectively.

The reset terminal 139 formed in the source S illustrated in FIGS. 27 through 30 may be doped with N+ type impurities when the single transistor is a PMOS transistor and may be doped with P+ type impurities when the single transistor is an NMOS transistor. The reset terminal 139 may receive the reset voltage signal RVS from the row driver block 160 and eliminate photocharge from the photodiode 133.

Figure 31:
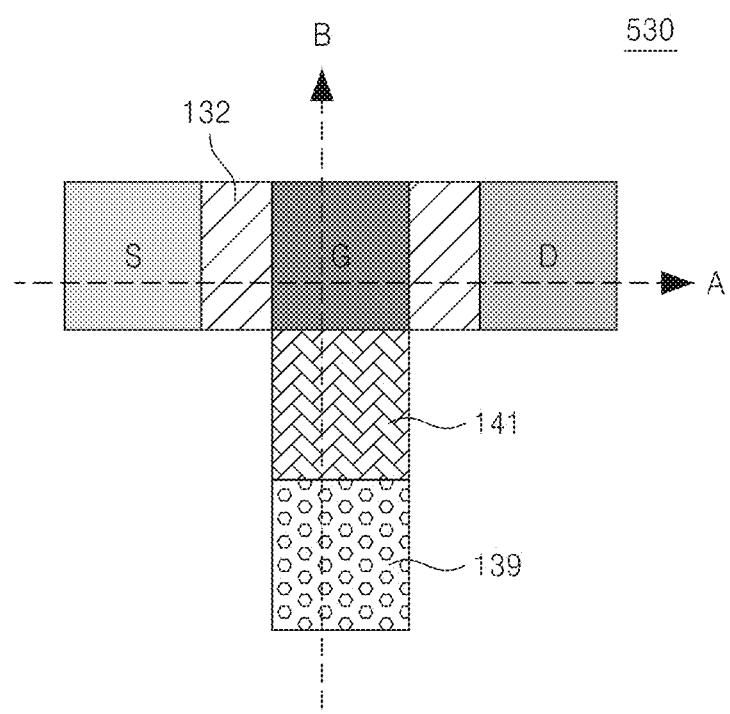
FIG. 31 is a diagram of a layout for forming the unit pixel illustrated in FIG. 2 according to yet other example embodiments of the inventive concepts.

FIG. 31 is a diagram of a layout 530 for forming the unit pixel 120 illustrated in FIG. 2 according to yet other example embodiments of the inventive concepts.

Referring to FIGS. 2, 11, and 31, like the layout 130 illustrated in FIG. 11, the layout 530 includes the source S, gate G and drain D of a single transistor, the channel 131, and the well layer 132. The layout 530 may also include the reset terminal 139 below the gate G so that a reset well layer 141 is interposed between the reset terminal 139 and the gate G.

Although not shown in FIG. 31, the STI (138 in FIGS. 33C and 33D) for electrical isolation from unit pixels (not shown) adjacent in the direction A or B may be formed. In addition, the back-gate (B in FIGS. 33C and 33D) receiving the back-gate voltage signal BVS illustrated in FIG. 2 may be formed in the STI 138. The back-gate B may receive one of the back-gate voltage signals BVS1 through BVSn from the row driver block 160.

Figure 32:
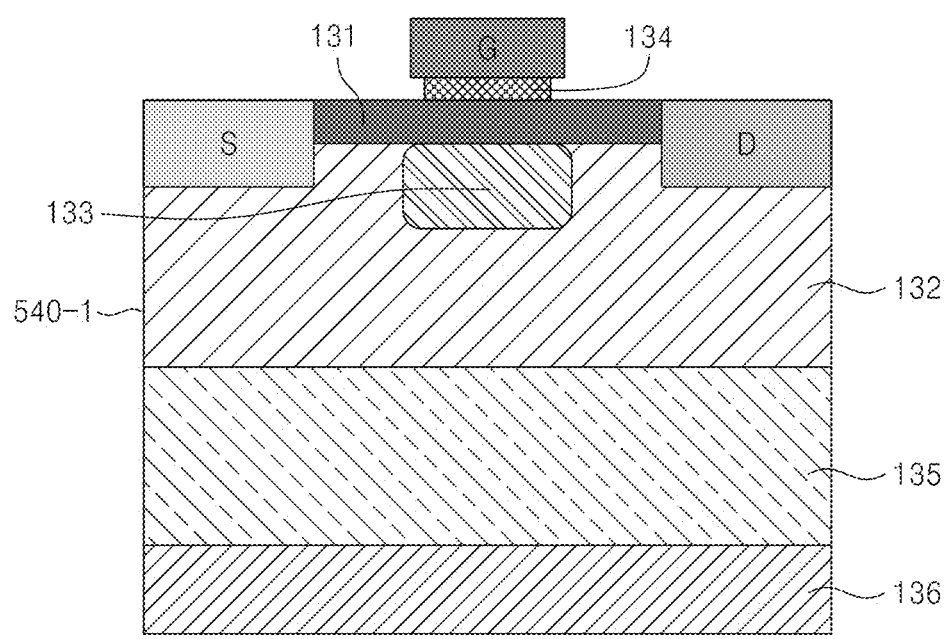
FIG. 32 is a diagram of an example of the cross-section of a semiconductor substrate taken along the direction A in the layout illustrated in FIG. 31.
Figure 33A:
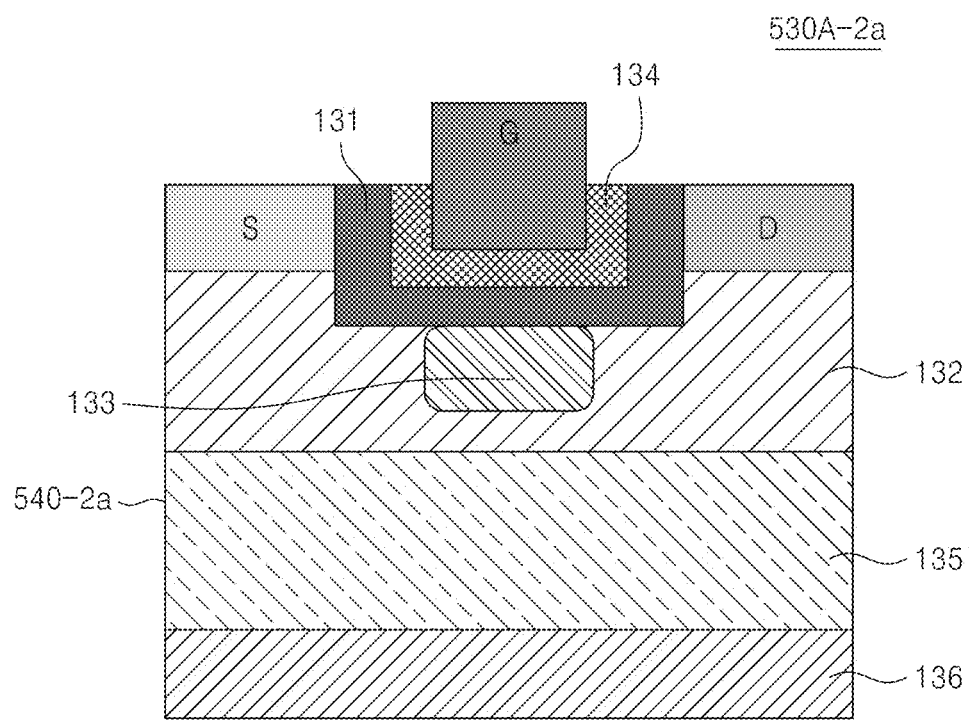
FIG. 33A is a diagram of another example of the cross-section of a semiconductor substrate taken along the direction A in the layout illustrated in FIG. 31.
Figure 33B:
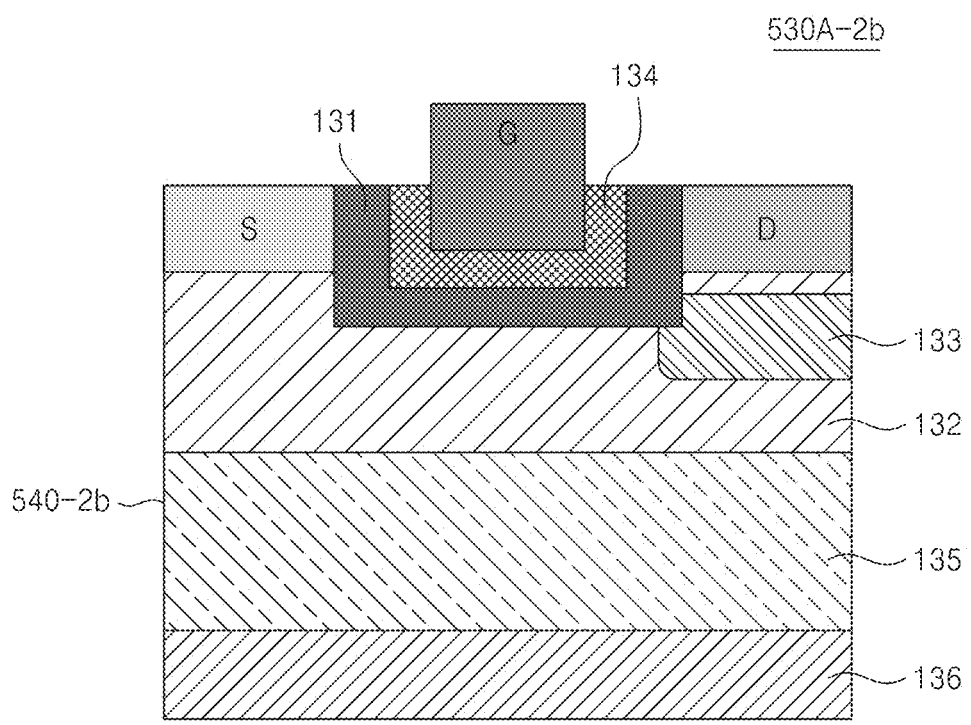
FIG. 33B is a diagram of yet another example of the cross-section of a semiconductor substrate taken along the direction A in the layout illustrated in FIG. 31.
Figure 33C:
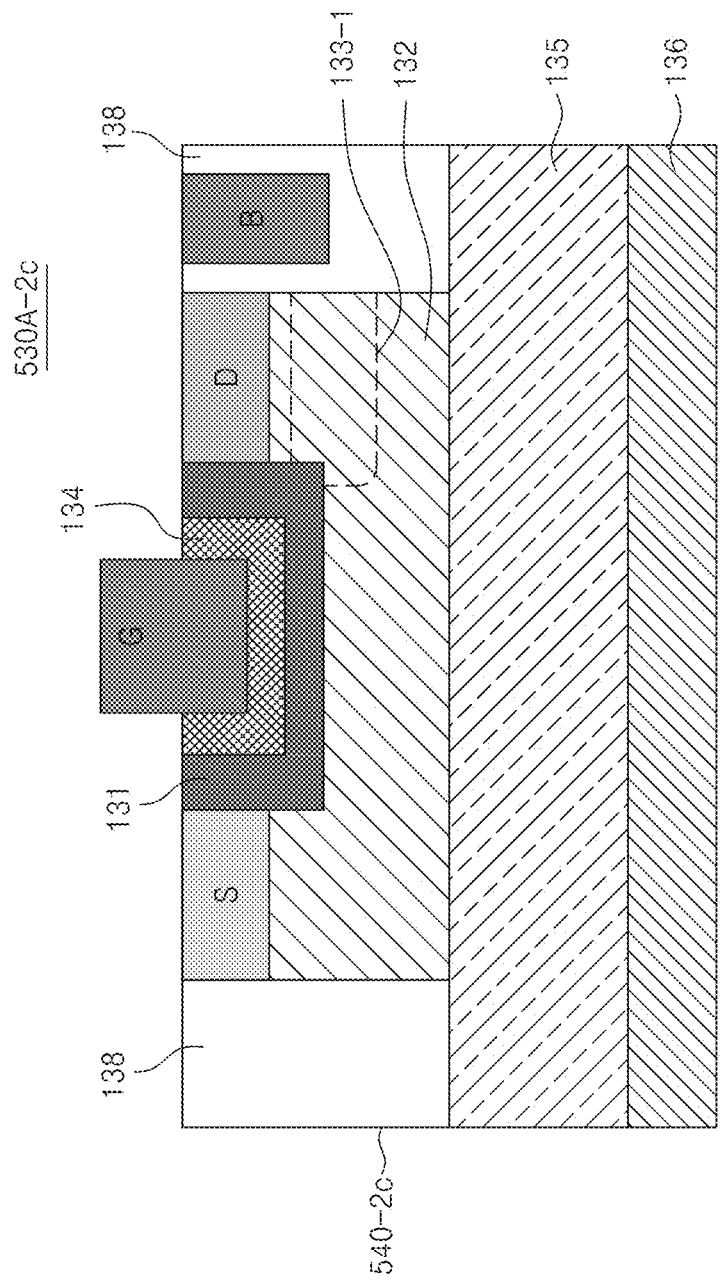
FIG. 33C is a diagram of still another example of the cross-section of a semiconductor substrate taken along the direction A in the layout illustrated in FIG. 31.
Figure 33D:
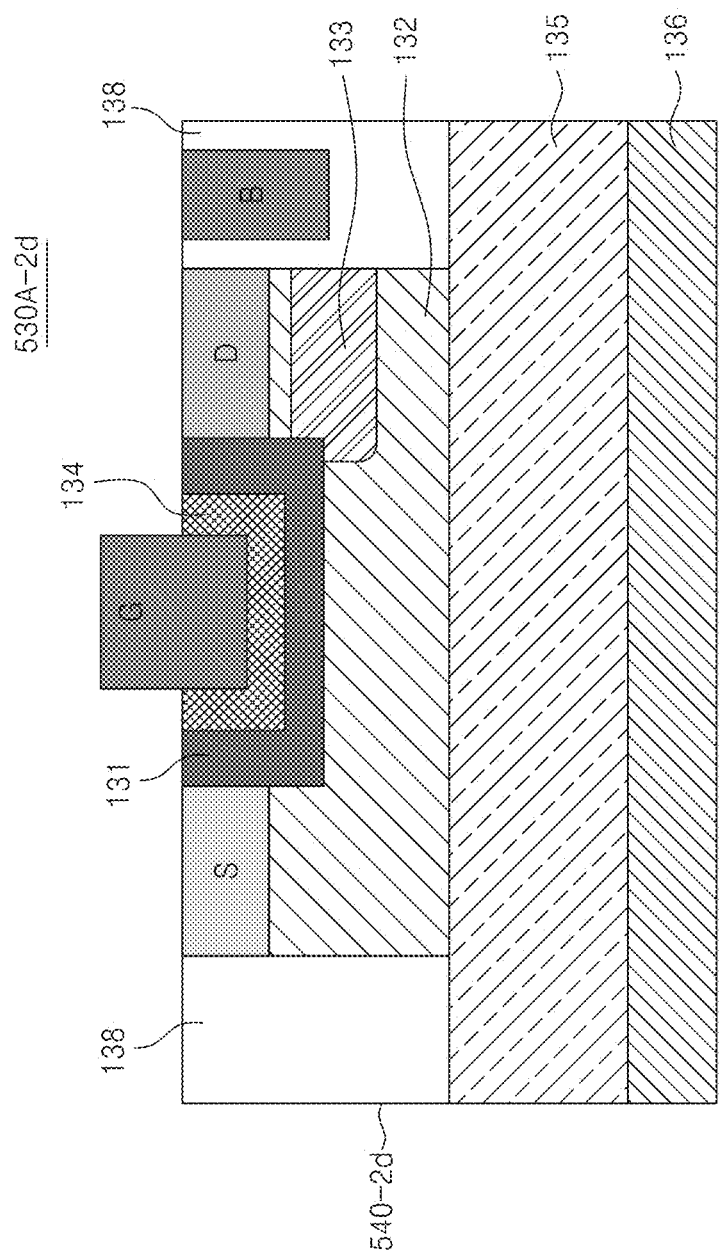
FIG. 33D is a diagram of another example of the cross-section of a semiconductor substrate taken along the direction A in the layout illustrated in FIG. 31.
Figure 34:
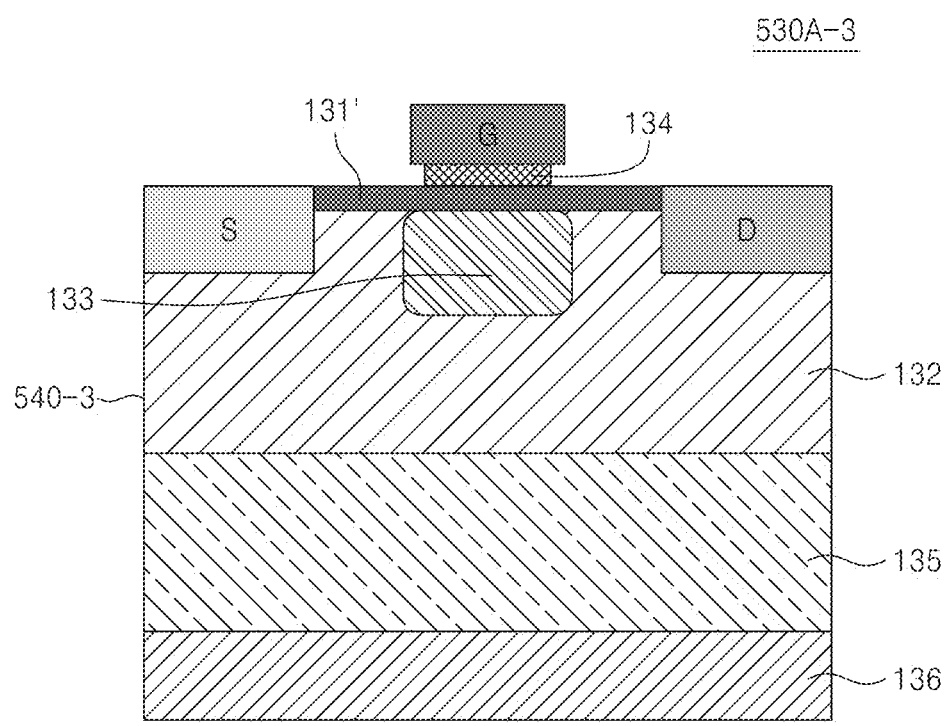
FIG. 34 is a diagram of yet another example of the cross-section of a semiconductor substrate taken along the direction A in the layout illustrated in FIG. 31.
Figure 35:
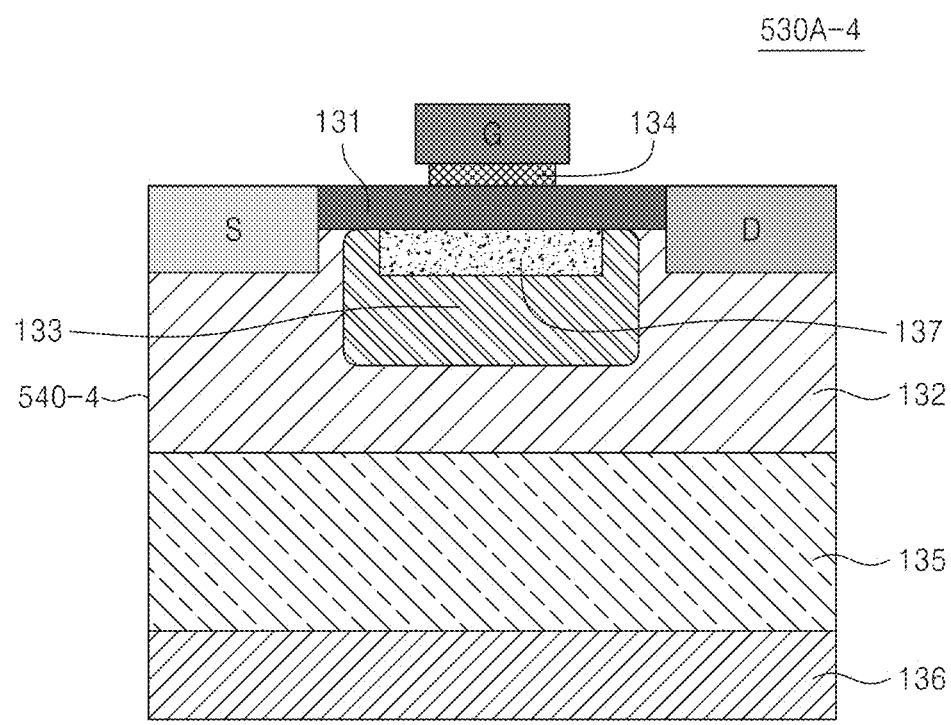
FIG. 35 is a diagram of still another example of the cross-section of a semiconductor substrate taken along the direction A in the layout illustrated in FIG. 31.

FIG. 32 is a diagram of an example 530A-1 of the cross-section of a semiconductor substrate 540-1 taken along the direction A in the layout 530 illustrated in FIG. 31. FIG. 33A is a diagram of another example 530A-2a of the cross-section of a semiconductor substrate 540-2a taken along the direction A in the layout 530 illustrated in FIG. 31. FIG. 33B is a diagram of yet another example 530A-2b of the cross-section of a semiconductor substrate 540-2b taken along the direction A in the layout 530 illustrated in FIG. 31. FIG. 33C is a diagram of still another example 530A-2c of the cross-section of a semiconductor substrate 540-2c taken along the direction A in the layout 530 illustrated in FIG. 31. FIG. 33D is a diagram of another example 530A-2d of the cross-section of a semiconductor substrate 540-2d taken along the direction A in the layout 530 illustrated in FIG. 31. FIG. 34 is a diagram of yet another example 530A-3 of the cross-section of a semiconductor substrate 540-3 taken along the direction A in the layout 530 illustrated in FIG. 31. FIG. 35 is a diagram of still another example 530A-4 of the cross-section of a semiconductor substrate 540-4 taken along the direction A in the layout 530 illustrated in FIG. 31.

Referring to FIGS. 12 through 15 and 32 through 35, the source S, gate G, drain D and back-gate B of the single transistor, the channel 131, the well layer 132, the photodiode 133, the gate insulating layer 134, the first epitaxial layer 135, the second epitaxial layer 136, the internal photodiode 137, and the STI 138 in the examples 530A-1 through 530A-4 are substantially the same as those illustrated in FIGS. 12 through 15, respectively.

Figure 36:
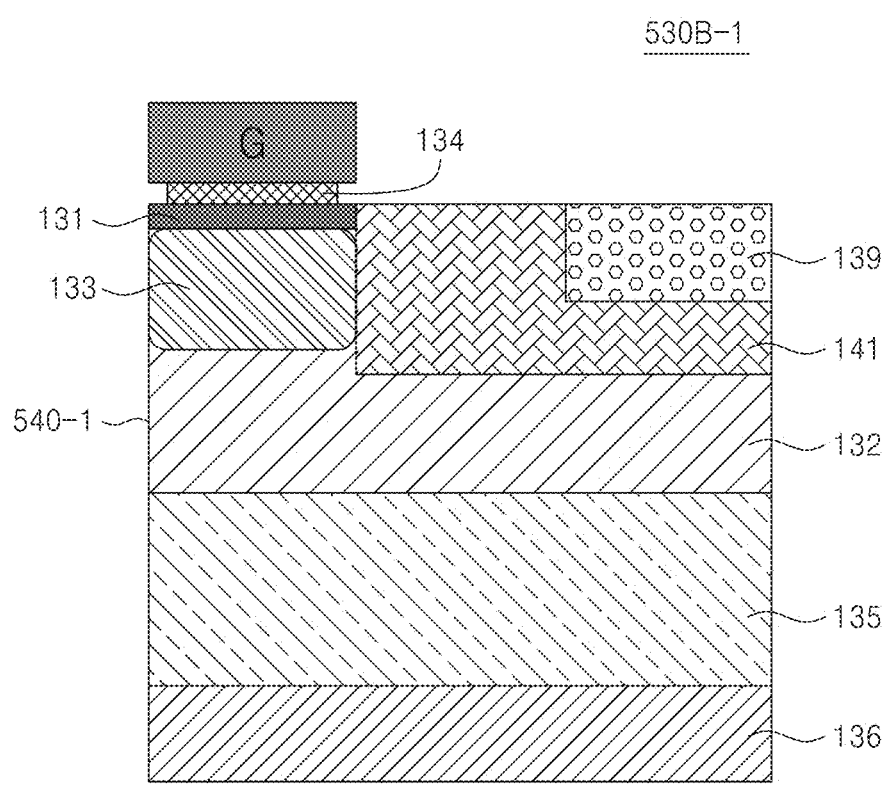
FIG. 36 is a diagram of an example of the cross-section of a semiconductor substrate taken along the direction B in the layout illustrated in FIG. 31.
Figure 37:
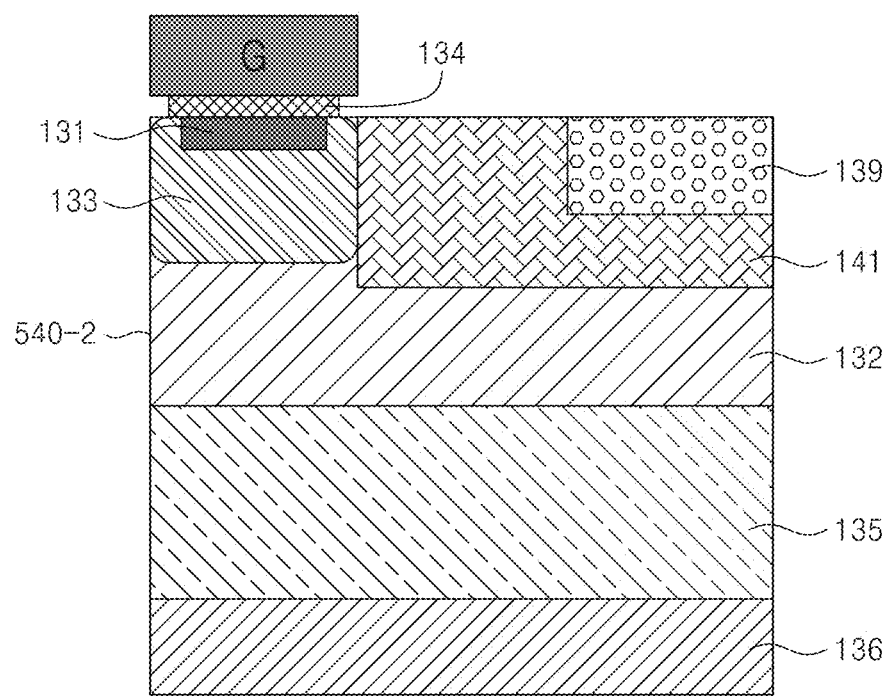
FIG. 37 is a diagram of another example of the cross-section of a semiconductor substrate taken along the direction B in the layout illustrated in FIG. 31.
Figure 38:
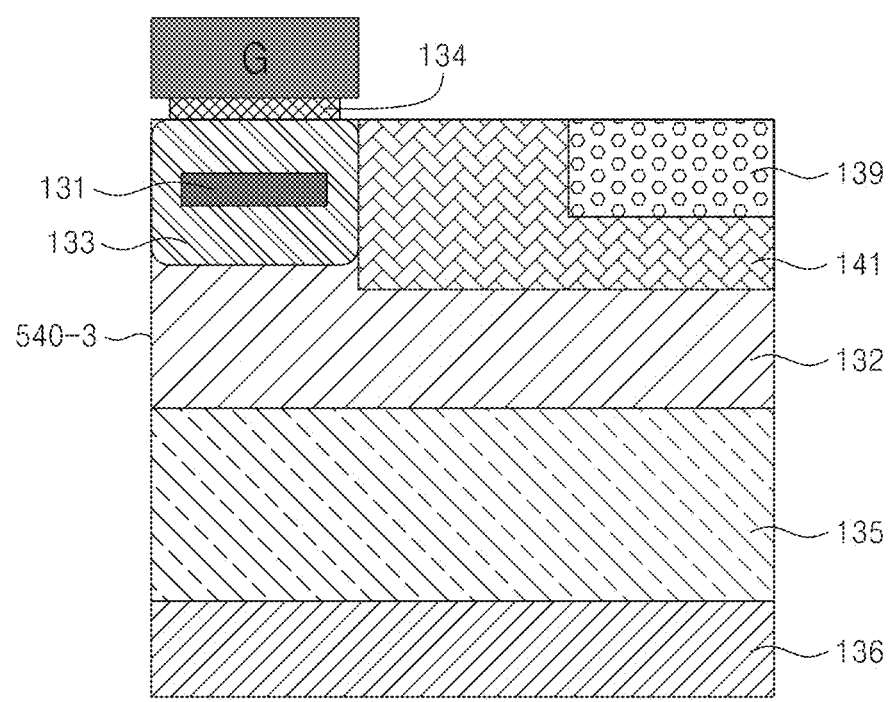
FIG. 38 is a diagram of yet another example of the cross-section of a semiconductor substrate taken along the direction B in the layout illustrated in FIG. 31.

FIG. 36 is a diagram of an example 530B-1 of the cross-section of the semiconductor substrate 540-1 taken along the direction B in the layout 530 illustrated in FIG. 31. FIG. 37 is a diagram of another example 530B-2 of the cross-section of the semiconductor substrate 540-2 taken along the direction B in the layout 530 illustrated in FIG. 31. FIG. 38 is a diagram of yet another example 530B-3 of the cross-section of the semiconductor substrate 540-3 taken along the direction B in the layout 530 illustrated in FIG. 31.

Referring to FIGS. 16 through 18 and 36 through 38, the gate G of the single transistor, the channel 131, the well layer 132, the photodiode 133, the gate insulating layer 134, the first epitaxial layer 135, and the second epitaxial layer 136 in the examples 530B-1 through 530B-3 are substantially the same as those illustrated in FIGS. 16 through 18, respectively.

In the examples 530B-1 through 530B-3 respectively illustrated in FIGS. 36 through 38, the reset terminal 139 and the reset well layer 141 may be formed. The reset terminal 139 may be doped with N+ type impurities when the single transistor is a PMOS transistor and may be doped with P+ type impurities when the single transistor is an NMOS transistor. The reset terminal 139 may receive the reset voltage signal RVS from the row driver block 160 and eliminate photocharge from the photodiode 133. The reset well layer 141 may be formed contacting the photodiode 133 and the reset terminal 139 to transfer photocharge from the photodiode 133 to the reset terminal 139.

In addition, the positional relationship among the channel 131, the photodiode 133, and the gate insulating layer 134 in the examples 530B-1 through 530B-3 is substantially the same as that in the examples 130B-1 through 130B-3, respectively, illustrated in FIGS. 16 through 18. Thus, the description thereof will be omitted.

The layouts, the cross-sections taken in the direction A, the cross-sections taken in the direction B, which have been described with reference to FIGS. 11 through 38, are not independent from one another and may be combined with each other when necessary.

FIG. 39 is a diagram showing voltages applied to the unit pixel 120 illustrated in FIG. 2 in different operation modes according to some example embodiments of the inventive concepts.

Referring to FIGS. 2, 10, 12, and 39, FIG. 39 shows the voltages applied to the unit pixel 120 in the integration mode, the reset mode, and the readout mode. It is defined that a voltage value appearing when the source voltage signal SVS is applied to the source S of the single transistor SX is a source voltage Vs, a voltage value appearing when the gate voltage signal GVS is applied to the gate G of the single transistor SX is a gate voltage Vg, a voltage value output to the drain D of the single transistor SX is a drain voltage Vd, and a voltage value applied to a semiconductor substrate, e.g., the well layer 132 in FIG. 12 is a substrate voltage Vsub.

In order to induce photocharge amplification by avalanche effect in the integration mode, the source voltage Vs, the gate voltage Vg, and the substrate voltage Vsub may be a first integration voltage VINT1, a second integration voltage VINT2, and 0V, respectively. For instance, when the single transistor SX is a PMOS transistor, the first integration voltage VINT1 may be 0 V and the second integration voltage VINT2 may be 0 V or a positive voltage (e.g., 0 to 5 V). When the single transistor SX is an NMOS transistor, the first integration voltage VINT1 may be 0 V and the second integration voltage VINT2 may be 0 V or a negative voltage (e.g., 0 to −5 V). When the single transistor SX enters the integration mode at the reception of voltage, the single transistor SX is deactivated and photocharge is generated corresponding to the intensity of light input to the photodiode PD and accumulated in the single transistor SX. The drain voltage Vd may be 0 V.

Alternatively, a high voltage (e.g., 3.3 V or higher in case of a PMOS transistor) or a low voltage (e.g., −3.3 V or lower in case of an NMOS transistor) may be applied to the source S or the drain D instead of the gate G in order to raise photocharge amplification by avalanche effect in the integration mode.

In order to prevent photocharge from being accumulated by the photodiode PD, a particular voltage (a negative voltage for a PMOS transistor or a positive voltage for an NMOS transistor) may be applied to the source S and the drain D to block photocharge from flowing into the photodiode PD. In other words, electric shutter may be realized by adjusting the voltage at the source S and the drain D.

In the reset mode, the source voltage Vs, the gate voltage Vg, and the substrate voltage Vsub may be a first reset voltage VRESET1, a second reset voltage VRESET2, and 0V, respectively. For instance, when the single transistor SX is a PMOS transistor, the first reset voltage VRESET1 may be a positive voltage of at least 1.5 V and the second reset voltage VRESET2 may be 0 V. When the single transistor SX is an NMOS transistor, the first reset voltage VRESET1 may be a negative voltage of at most −1.5 V and the second reset voltage VRESET2 may be 0 V. When the single transistor SX enters the reset mode at the reception of voltage, photocharge accumulated at the photodiode PD may be reset through a semiconductor substrate, e.g., the well layer 132 in FIG. 12. The drain voltage Vd may be 0V.

In the readout mode, the source voltage Vs, the gate voltage Vg, and the substrate voltage Vsub may be a first read voltage VREAD1, a second read voltage VREAD2, and 0V, respectively. For instance, when the single transistor SX is a PMOS transistor, the first read voltage VREAD1 may be a power supply voltage VDD and the second read voltage VREAD2 may be lower than a threshold voltage of the single transistor SX when there is no influence from the photodiode PD. When the single transistor SX is an NMOS transistor, the first read voltage VREAD1 may be the power supply voltage VDD and the second read voltage VREAD2 may be higher than the threshold voltage of the single transistor SX when there is no influence from the photodiode PD. The power supply voltage VDD may be a power supply voltage of the image sensor 100 and may be −3 to 3 V. When the single transistor SX enters the readout mode at the reception of voltage, the change in the threshold voltage of the single transistor SX with respect to the photocharge accumulated at the photodiode PD may be sensed and the drain voltage Vd (i.e., the power supply voltage VDD) may be output as a pixel signal Vout.

For instance, it is assumed that the single transistor SX is an NMOS transistor, the threshold voltage of the single transistor SX when there is no influence from the photodiode PD is 1 V, and the threshold voltage changes to 1.4 V when one photocharge is generated by the photodiode PD. When one photocharge is generated by the photodiode PD, the single transistor SX may be activated and the pixel signal Vout of a high level (e.g., 1 V) may be output. When there is no photocharge generated by the photodiode PD, the single transistor SX may be deactivated and the pixel signal Vout of a low level (e.g., 0 V) may be output.

Figure 40:
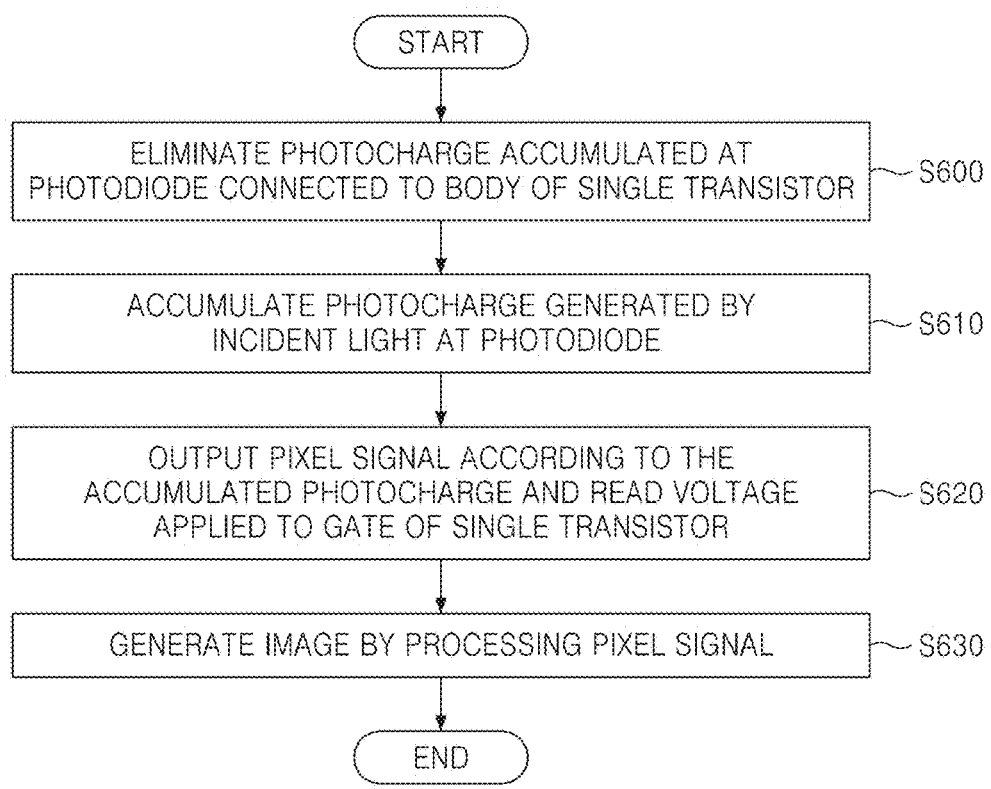
FIG. 40 is a flowchart of a method of operating the image processing system illustrated in FIG. 1 according to some example embodiments of the inventive concepts.

FIG. 40 is a flowchart of a method of operating the image processing system 10 illustrated in FIG. 1 according to some example embodiments of the inventive concepts.

Referring to FIGS. 1 through 3, 10, 39, and 40, photocharge accumulated at the photodiode PD connected to the body of the single transistor SX may be eliminated in response to the first reset voltage VRESET1 and the second reset voltage VRESET2 respectively applied to the source and the gate of the single transistor SX in the reset mode in operation S600.

Light reflected from the object 400 is incident on the pixel array 110 through the lens 500. The photodiode PD included in each of the unit pixels 120 of the pixel array 110 may accumulate photocharge generated according to the intensity of the incident light in the integration mode in operation S610. Each unit pixel 120 may output a pixel signal according to the second read voltage VREAD2 applied to the gate of the single transistor SX based on the accumulated photocharge and the gate voltage signal GVS in the readout mode in operation S620. At this time, the unit pixels 120 may sequentially output a digital pixel signal according to the control of the row driver block 160.

The readout block 190 may amplify and temporarily store pixel signals output from the pixel array 110. The readout block 190 may sequentially transmit the pixel signals to the image signal processor 220 according to the control of the timing generator 170. The image signal processor 220 may generate an image in each of the unit pixels 120 as shown in FIG. 3A or may generate an image in each of the sub pixel groups 114-1 through 114-4 including a plurality of unit pixels 120 as shown in FIG. 3B in operation S630.

Figure 41:
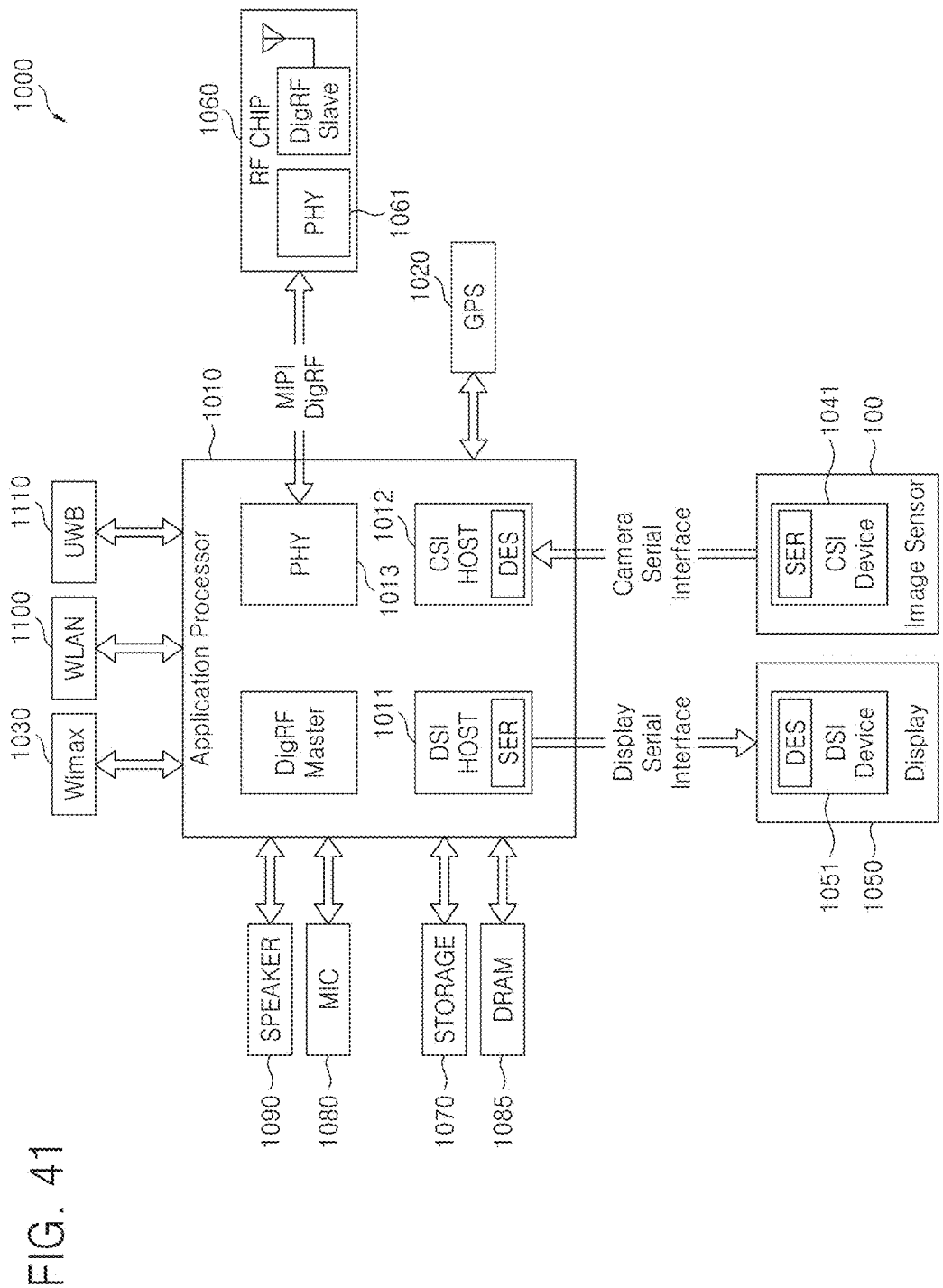
FIG. 41 is a block diagram of an electronic system including the image sensor illustrated in FIG. 1 according to some example embodiments of the inventive concepts.

FIG. 41 is a block diagram of an electronic system 1000 including the image sensor 100 illustrated in FIG. 1 according to some example embodiments of the inventive concepts.

Referring to FIGS. 1 and 41, the electronic system 1000 may be implemented as a data processing device, such as a mobile phone, a personal digital assistant (PDA), a portable media player (PMP), an Internet protocol television (IPTV), or a smart phone, which can use or support mobile industry processor interface (MIPI). The electronic system 1000 includes the image sensor 100, an application processor 1010, and a display 1050.

A camera serial interface (CSI) host 1012 implemented in the application processor 1010 may perform serial communication with a CSI device 1041 included in the image sensor 100 through CSI. At this time, an optical deserializer DES and an optical serializer SER may be implemented in the CSI host 1012 and the CSI device 1041, respectively.

A display serial interface (DSI) host 1011 implemented in the application processor 1010 may perform serial communication with a DSI device 1051 included in the display 1050 through DSI. At this time, an optical serializer SER and an optical deserializer DES may be implemented in the DSI host 1011 and the DSI device 1051, respectively.

The electronic system 1000 may also include a radio frequency (RF) chip 1060 communicating with the application processor 1010. A physical layer (PHY) 1013 of the application processor 1010 and a PHY 1061 of the RF chip 1060 may communicate data with each other according to MIPIDigRF.

The electronic system 1000 may further include a global positioning system (GPS) 1020, a storage 1070, a microphone (MIC) 1080, a dynamic random access memory (DRAM) 1085, and a speaker 1090. The electronic system 1000 may communicate using a worldwide interoperability for microwave access (Wimax) 1030, a wireless local area network (WLAN) 1100, and/or an ultra-wideband (UWB) 1110.

Figure 42:
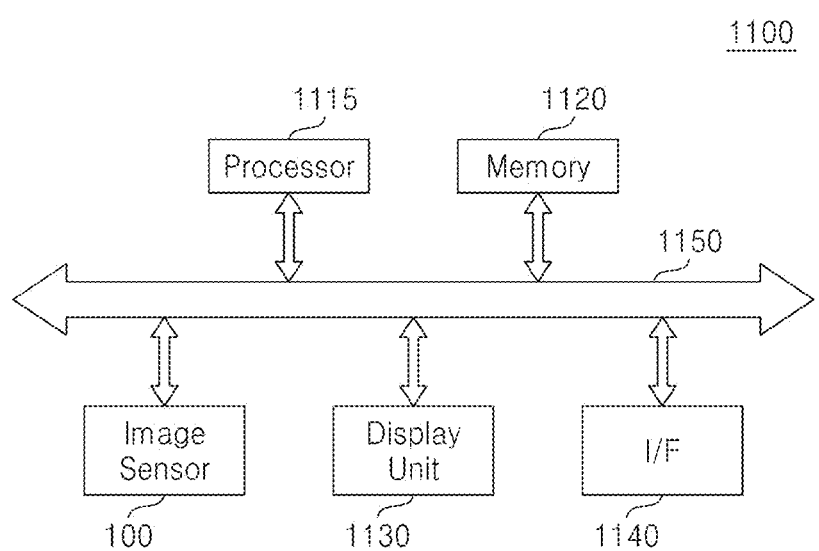
FIG. 42 is a block diagram of an electronic system including the image sensor illustrated in FIG. 1 according to other example embodiments of the inventive concepts.

FIG. 42 is a block diagram of an electronic system 1100 including the image sensor 100 illustrated in FIG. 1 according to other example embodiments of the inventive concepts.

Referring to FIGS. 1 and 42, the electronic system 1100 may include the image sensor 100, a processor 1115, a memory 1120, a display unit 1130, and an I/F 1140.

The processor 1115 may control the operation of the image sensor 100. For instance, the processor 1115 may generate two-dimensional and/or three-dimensional image data based on color information and/or depth information from the image sensor 100.

The memory 1120 may store a program for controlling the operation of the image sensor 100 through a bus 1150 according to the control of the processor 1115 and may store an image generated by the processor 1115. The processor 1115 may access the memory 1120 and execute the program. The memory 1120 may be implemented by non-volatile memory. The image sensor 100 may generate two-dimensional and/or three-dimensional image data based on digital pixel signals (e.g., color information and/or depth information) according to the control of the processor 1115.

The display unit 1130 may receive the image from the processor 1115 or the memory 1120 and display the image through a liquid crystal display (LCD) or an active matrix organic light emitting diode (AMOLED). The I/F 1140 may be implemented to input and output two- or three-dimensional images. The I/F 1140 may be a wireless I/F.

Figure 43:
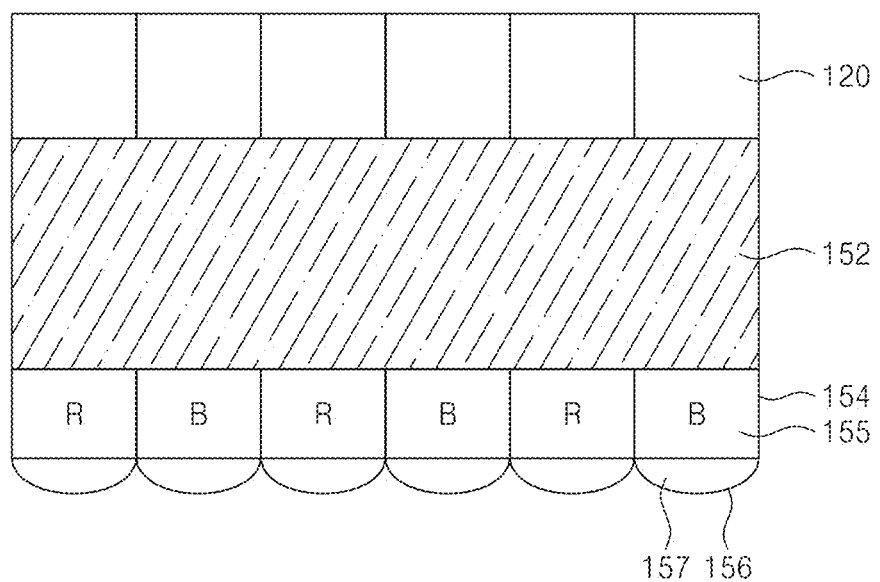
FIG. 43 is a diagram of a cross-section of the pixel array illustrated in FIG. 1 according to some example embodiments of the inventive concepts.

FIG. 43 is a diagram of a cross-section 150-1 of the pixel array 110 illustrated in FIG. 1 according to some example embodiments of the inventive concepts.

Referring to FIGS. 1 through 3B, 10 through 38, and 43, FIG. 43 shows the cross-section 150-1 of the pixel array 110 taken along the row direction or the column direction. For convenience' sake in the description, the cross-section 150-1 includes only six unit pixels 120.

The cross-section 150-1 may include the unit pixels 120, a third epitaxial layer 152, a color filter layer 154, and a micro lens layer 156. It is assumed that the micro lens layer 156 through which incident light passes first corresponds to a lower part and the unit pixels 120 correspond to an upper part.

A plurality of the unit pixels 120 may be arranged in line. Each unit pixel 120 may be implemented according to one of the layouts respectively illustrated in FIGS. 11, 19, 23, 26, and 31. A cross-section of the unit pixel 120 taken in the row or column direction may correspond to one of the cross-sections respectively illustrated in FIGS. 12 through 18, 20 through 22, 24, 25, 27 through 30, and 32 through 38.

Accordingly, the third epitaxial layer 152 may be further from the gate G of the unit pixel 120 than the second epitaxial layer 136. In this case, the photodiode 133 may be positioned closer to the micro lens layer 156 than a metal layer (not shown) for the wiring of the pixel array 110 (which is back side illumination (BSI) architecture), so that light gathering power of the photodiode 133 is increased.

The third epitaxial layer 152 may be formed below the unit pixels 120. Like the first and second epitaxial layers 135 and 136, the third epitaxial layer 152 may be formed using an epitaxial growth method. The third epitaxial layer 152 may be doped with P− type impurities.

The color filter layer 154 may be formed below the third epitaxial layer 152 and may selectively pass light with a desired (or alternatively, a predetermined) wavelength (e.g., red, green, blue, magenta, yellow, or cyan). A planarization layer (not shown) called an over-coating layer may be formed on the color filter layer 154. The color filter layer 154 may be omitted when the unit pixels 120 are depth pixels.

A color filter 155 in the color filter layer 154 may be positioned to correspond to each of the unit pixels 120. For instance, different color filters R and B may alternate for each of adjacent unit pixels 120 as shown in FIG. 43.

The micro lens layer 156 may be formed below the color filter layer 154. A micro lens 157 in the micro lens layer 156 may be positioned to correspond to each of the unit pixels 120. The micro lens layer 156 may be used to increase light gathering power and thus to increase the quality of image. The micro lens layer 156 may be omitted in other embodiments.

When the pixel array 110 is formed as shown in FIG. 43, pixel signals output from the pixel array 110 may be processed in a single frame by the image signal processor 220, as described above with reference to FIG. 3A. In other words, each unit pixel 120 may be treated as a single pixel. For instance, a unit pixel 120 corresponding to a red filter R may be treated as a red pixel and a unit pixel 120 corresponding to a blue filter B may be treated as a blue pixel.

Figure 44:
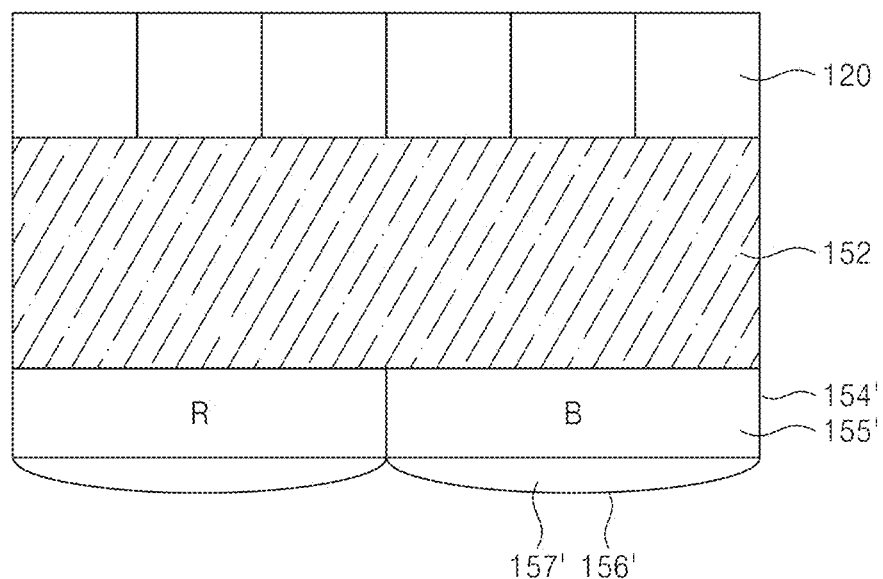
FIG. 44 is a diagram of a cross-section of the pixel array illustrated in FIG. 1 according to other example embodiments of the inventive concepts.

FIG. 44 is a diagram of a cross-section 150-2 of the pixel array 110 illustrated in FIG. 1 according to other example embodiments of the inventive concepts.

Referring to FIGS. 1 through 3B, 10 through 38, 43, and 44, FIG. 44 shows the cross-section 150-2 of the pixel array 110 taken along the row direction or the column direction. The unit pixels 120 and the third epitaxial layer 152 illustrated in FIG. 44 are substantially the same as those illustrated in FIG. 42.

A color filter 155' included in a color filter layer 154' may be positioned to correspond to a plurality of unit pixels 120. For instance, a red filter R and a blue filter B may alternate for every three unit pixels 120, as shown in FIG. 44. A micro lens 157' in a micro lens layer 156' may be positioned to correspond to the plurality of the unit pixels 120.

When the pixel array 110 is formed as shown in FIG. 44, each unit pixel 120 may be treated as a single sub pixel, as described with reference to FIG. 3B. Accordingly, a group of unit pixels 120 corresponding to one color filter 155' may function as a single pixel. For instance, three unit pixels 120 corresponding to the red filter R may be treated together as a single red pixel and three unit pixels 120 corresponding to the blue filter B may be treated together as a single blue pixel. Although three unit pixels 120 are treated together as a single pixel in the embodiments illustrated in FIG. 44, the example embodiments are not restricted to the current embodiments.

As described above, according to some example embodiments, an image sensor includes a single transistor and a photodiode in a unit pixel, thereby increasing the degree of integration. In addition, since a pixel array in the image sensor directly outputs a digital pixel signal, a circuit for analog-to-digital conversion is not necessary. As a result, noise and power consumption may be reduced.

While the example embodiments has been particularly shown and described with reference to example embodiments thereof, it will be understood by those of ordinary skill in the art that various changes in forms and details may be made therein without departing from the spirit and scope of the inventive concepts as defined by the following claims.

What is claimed is:

1. An image sensor comprising:
a pixel array including a plurality of unit pixels; and
a readout block configured to sense a pixel signal output from each of the plurality of unit pixels, each unit pixel having a single transistor and a photodiode, and
wherein the single transistor includes,
the photodiode,
a drain and a source, formed in a semiconductor substrate, of the single transistor,
a first gate formed by a recessed region between the drain and the source, and
a gate insulating layer formed on a side of the first gate and below the first gate for insulation of the first gate; and
wherein each unit pixel further includes,
a first region formed below the drain, the source and the first gate and doped with first-type impurities, and
a second region formed below the first region and doped with second-type impurities.

2. The image sensor of claim 1, wherein the photodiode is formed within the first region, and doped with the first-type impurities.

3. The image sensor of claim 1, wherein each unit pixel further comprises a trench for electrical isolation from adjacent unit pixel.

4. The image sensor of claim 3, wherein each unit pixel further comprises a second gate formed within the trench.

5. The image sensor of claim 4, wherein the photodiode is closer to the drain than to the source, the second gate is configured to receive a back-gate voltage from a row driver block, and the photodiode is a virtual photodiode formed by the back-gate voltage.

6. The image sensor of claim 1, wherein a top surface of the photodiode is lower than a top surface of the source of the single transistor and a top surface of the drain of the single transistor.

7. The image sensor of claim 1, further comprising:
a channel connecting the source and the drain of the single transistor with each other, and
wherein the channel has at least one side contacting the photodiode and is formed using one of silicon Si, germanium Ge, and silicon-germanium SiGe.

8. The image sensor of claim 1, further comprising:
a row driver block configured to enable one of a plurality of rows in the pixel array to enter a readout mode by selectively manipulating a source voltage and a gate voltage of each of the single transistors included in the row operating in the readout mode.

9. The image sensor of claim 8, wherein
the row driver block is configured to enable the plurality of unit pixels to enter an integration mode and a reset mode by controlling the source voltage and the gate voltage of the single transistor,
the photodiode is configured to accumulate photocharge varying with intensity of incident light in the integration mode, and
the single transistor is configured to eliminate the photocharge in the reset mode.

10. An image sensor comprising:
a pixel array including a plurality of unit pixels configured to output pixel signals, each unit pixel having a single transistor and a photodiode, and
wherein the single transistor includes,
a drain and a source formed in a semiconductor substrate,
a first gate formed by a recessed region between the drain and the source, and
a gate insulating layer formed on a side of the first gate and below the first gate for insulation of the first gate; and
wherein each unit pixel further includes,
a first region formed below the drain, the source and the first gate and doped with first-type impurities, and
a second region formed below the first region and doped with second-type impurities.

11. The image sensor of claim 10, further comprising:
a channel connecting the source and the drain of the single transistor with each other, and wherein
the photodiode is formed below the channel, and doped with first-type impurities.

12. The image sensor of claim 10, wherein each unit pixel further comprises:
a trench for electrical isolation from adjacent unit pixel.

13. The image sensor of claim 12, wherein each unit pixel further comprises:
a second gate formed within the trench.

14. The image sensor of claim 13, wherein the second gate is configured to receive a back-gate voltage from a row driver block to enable the plurality of unit pixels in a row to enter a readout mode.

15. The image sensor of claim 10, wherein the photodiode is configured to accumulate photocharge therein during an integration mode and the single transistor is configured to discharge the photocharge during a reset mode, and wherein the source of the single transistor is configured to receive a source voltage, the drain of the single transistor is configured to receive a column voltage and the first gate in the recessed region is configured to receive a gate voltage.

16. The image sensor of claim 15, further comprising:
   a plurality of sense amplifiers configured to amplify the pixel signals based on the pixel signals and a reference during a readout mode; and
   a row driver configured to selectively manipulate the source voltage to the source and the gate voltage to the drain of each of a plurality of the single transistor in a driven row of the pixel array to put the plurality of the single transistor in the driven row into one of the readout mode, the integration mode and the reset mode.

17. The image sensor of claim 16, wherein the photodiode is configured to vary a threshold voltage of an associated transistor by varying a voltage level of a bulk of the associated transistor based on an amount of the photocharge therein.

18. The image sensor of claim 17, wherein the image sensor is configured to perform analog to digital conversion by varying the threshold voltage of the plurality of the single transistor without use of an analog to digital conversion circuit.

* * * * *